United States Patent [19]

Morishita

[11] Patent Number: 5,144,398
[45] Date of Patent: Sep. 1, 1992

[54] SEMICONDUCTOR DEVICE AND PHOTOELECTRIC CONVERSION APPARATUS USING THE SAME

[75] Inventor: Masakazu Morishita, Atsugi, Japan

[73] Assignee: Canon Kabushiki Kaisha, Tokyo, Japan

[21] Appl. No.: 815,844

[22] Filed: Dec. 31, 1991

Related U.S. Application Data

[63] Continuation of Ser. No. 500,797, Mar. 28, 1990, abandoned.

[30] Foreign Application Priority Data

Mar. 29, 1989 [JP] Japan .................. 1-77442
Mar. 29, 1989 [JP] Japan .................. 1-77443
Mar. 29, 1989 [JP] Japan .................. 1-77444

[51] Int. Cl.⁵ .............................. H01L 29/72
[52] U.S. Cl. ........................ 357/34; 357/16; 357/59; 357/61
[58] Field of Search ............ 357/34, 16, 61, 59 H, 357/2

[56] References Cited

U.S. PATENT DOCUMENTS 4,794,440 12/1988 Capasso et al. ............. 357/16 X
4,885,614 12/1989 Furukawa et al. .......... 357/16

FOREIGN PATENT DOCUMENTS 62-163370 7/1987 Japan .................. 357/34

OTHER PUBLICATIONS

Patent Abstracts of Japan, vol. 11, No. 396, 1987 for JP-A-62-159460.
Appl. Phys. Lett., vol. 43, No. 10, 1983, pp. 949-951.
IEEE Electron Device Letters, vol. 9, No. 9, pp. 453-456 (1988).
Winstel et al. "Optoelektronik II", 1986, pp. 91-92.
Proc. 1987 Bipolar Circuits and Technology Meeting (Sep. 1987) pp. 54-56.
Appl. Phys. Lett., vol. 49, No. 19, 1986, pp. 1278-1280.
IBM Technical Disclosure Bulletin, vol. 27, No. 8, 1985, pp. 4693-4694.
J. Appl. Phys., vol. 57, No. 8, 1985, pp. 2717-2720.

Primary Examiner—Andrew J. James
Assistant Examiner—Sara W. Crane
Attorney, Agent, or Firm—Fitzpatrick, Cella, Harper & Scinto

[57] ABSTRACT

A semiconductor device comprises an emitter of first conductivity type, a base of second conductivity type, and a collector of first conductivity type. At least a vicinity of an interface of the emitter to base junction is formed by Si. Polycrystalline or single crystalline $Si_{1-x}C_x$ ($x \leq 0.5$) is formed on a region formed by the Si of said emitter. A junction between a region of the Si and a region of the polycrystalline and the single crystalline $Si_{1-x}C_x$ is a graded hetero junction.

20 Claims, 13 Drawing Sheets

FIG. 5
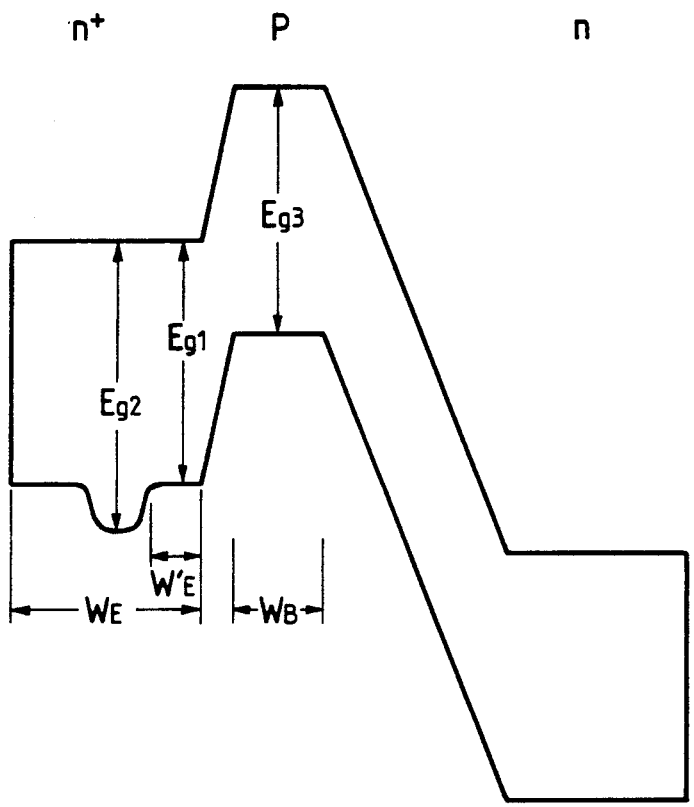
FIG. 6
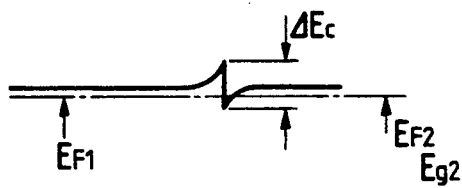
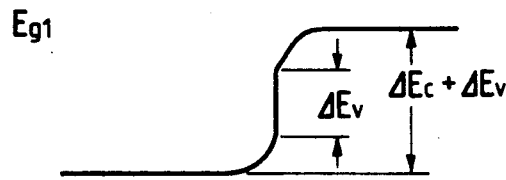

SEMICONDUCTOR DEVICE AND PHOTOELECTRIC CONVERSION APPARATUS USING THE SAME

This application is a continuation of application Ser. No. 07/500,797 filed Mar. 28, 1990, now abandoned.

BACKGROUND OF THE INVENTION

1. Field of the Invention

The present invention relates to a semiconductor device and a photoelectric conversion apparatus using the same.

2. Prior Art

A bipolar transistor (to be referred to as a BPT hereinafter) is conventionally known as a semiconductor device having a high operation speed, a high gain and a high withstand voltage.

Of conventional BPTs, a DOPOS BPT (Doped Poly Silicon BPT) is known as a BPT having a shallow junction and a high integration degree.

In a conventional BPT of this type, a natural oxide film having a film thickness of about 10 Å is formed between a polysilicon emitter region and a monocrystalline emitter region. This oxide film is broken or formed into balls by annealing at 1,000° C. or more.

FIG. 1 is a schematic sectional view for explaining a detailed arrangement of a conventional BPT. Referring to FIG. 1, a substrate 1 consisting of a semiconductor such as silicon has an n+-type buried region 2, an n−-type region 3 having a low impurity concentration, a p-type region 4 serving as a base region, an n+-type region 5 serving as an emitter region, an n-type region 6 serving as a channel stopper, an n+-type region 7 for decreasing a collector resistance of a BPT, an oxide film (SiO$_2$) 8 formed between a polysilicon emitter region and a monocrystalline emitter region, insulating films 101, 102, 103 and 104 for isolating elements, electrodes and wirings, and electrodes 200-1 to 200-3 consisting of, e.g., a metal, silicide and polycide.

The substrate 1 is of n type obtained by doping an impurity such as phosphorus (Ph), antimony (Sb) or arsenic or p type obtained by doping an impurity such as boron (B), aluminum (Al) or gallium (Ga). The buried region 2 need not be formed but is preferably provided in order to decrease the collector resistance. The n−-type region 3 is formed by an epitaxial technique or the like. An impurity such as boron (B), gallium (Ga) or aluminum (Al) is doped in the base region 4. Polycrystalline silicon is used as the emitter region 5.

In a BPT having the above arrangement, since a flow of holes from the base to the emitter can be blocked by a potential barrier formed in a valence band by a natural oxide film produced in an interface between the base and the emitter, a current gain can be advantageously increased.

FIG. 2 is a potential view schematically showing a potential obtained upon normal operation in a portion in which the natural oxide film is present in a depth direction of an A—A' section of the conventional semiconductor device shown in FIG. 1. Referring to FIG. 2, $W_E$ represents the thickness of an emitter neutral region, and $W_B$ represents a base neutral region. As shown in FIG. 2, a potential barrier is present at a position represented by $W_E'$ since the natural oxide film is partially formed between the emitter and base regions.

In this conventional semiconductor device, a base current mainly consists of the following components.

A diffusion current of holes from the base to the emitter consists of a current component approximately represented by equation 1-(1) in a portion in which the natural oxide film and therefore the potential barrier are present:

$$J_{B1} = (q \cdot n_i^2 \cdot D_p / N_E \cdot L_p) \times \tanh(W_E'/L_p)[\exp(V_{BE}/kT) - 1] \quad 1\text{-}(1)$$

A base current $J_{B1}$ injected from the base to the emitter in a portion in which no natural oxide film is present is represented by the following equation:

$$J_{B1} = (q \cdot n_i^2 \cdot D_p / N_E \cdot L_p) \times \coth(W_E/L_p)[\exp(V_{BE}/kT) - 1] \quad 1\text{-}(2)$$

If a grain size of polycrystals is large enough to satisfy $W_B \ll L_P$, the following equation is obtained:

$$J_{B1}' \simeq (q \cdot n_i^2 \cdot D_p / N_E \cdot W_E)[\exp(V_{BE}/kT) - 1] \quad 1\text{-}(3)$$

That is, $J_{B1}'$ is inversely proportional to the emitter thickness $W_E$ and is increased as $W_E$ is decreased. Therefore, as the integration degree of a semiconductor device is increased, $J_{B1}'$ is increased and a current gain $h_{FE}$ is decreased.

If a grain size of polysilicon is small enough to satisfy $W_E \geq L_P$, $\coth(W_E/L_P) \simeq 1$ is obtained since a diffusion length $L_P$ is small, and the following equation is obtained:

$$J_{B1}' \simeq (q \cdot n_i^2 \cdot D_p / N_E \cdot L_p)[\exp(V_{BE}/kT) - 1] \quad 1\text{-}(4)$$

Since $L_P$ is large, $J_{B1}'$ is increased. $L_P$ changes in accordance with the size or formation conditions of crystal grains of polysilicon, or a base current value is largely influenced by breakdown of the natural oxide film, thereby causing variations in individual BPTs or reducing stability.

A recombination current of electrons injected from the emitter is represented by:

$$J_{B2} = (q \cdot n_i^2 \cdot D_n / N_B \cdot L_n) \times \quad 1\text{-}(5)$$
$$[\{\cosh(W_B/L_N) - 1\}/\{\sinh(W_B/L_N)\}] \times [\exp(V_{BE}/kT) - 1]$$

A collector current is represented by:

$$J_C = (q \cdot n_i^2 \cdot D_n / N_B \cdot L_n)[\operatorname{cosech}(W_B/L_N)] \times [\exp(V_{BE}/kT) - 1] \quad 1\text{-}(6)$$

where q is the electric charge, $n_i$ is the intrinsic semiconductor charge density (Si), $N_E$ is the impurity concentration of the emitter, $N_B$ is the impurity concentration of the base, $D_P$ is the diffusion coefficient of holes, $D_N$ is the diffusion coefficient of electrons, $L_P$ is the diffusion coefficient of holes ($\simeq (D_p \tau_p)^{\frac{1}{2}}$), $L_N$ is the diffusion length of electrons ($\simeq (D_N \tau_N)^{\frac{1}{2}}$), k is the Boltzmann constant, T is the absolute temperature, and $V_{BE}$ is the base-emitter forward bias electron. Note that $\tau_P$ and $\tau_N$ represent minority carrier lifetimes of holes and electrons, respectively.

FIG. 3 is a schematic sectional view showing another arrangement of a conventional BPT. A difference between the BPTs shown in FIGS. 1 and 3 is that no natural oxide film is present between a polysilicon emitter region and a monocrystalline emitter region of the BPT shown in FIG. 3. In FIG. 3, the same reference numerals as in FIG. 1 denote the same parts.

In the BPT shown in FIG. 3, a base current becomes a current represented by equation 1-(4). Especially when a junction is shallowed in a semiconductor device having a high integration degree and a high density, the current is increased to decrease $h_{FE}$, thereby reducing current drive power. In a BPT in which all emitters consist of monocrystals, $h_{FE}$ is significantly decreased upon integration at a high integration degree.

In such a conventional BPT, an impurity concentration of an emitter region 5 is $10^{19}$ to $10^{21}$ cm$^{-3}$, that of a base region is $10^{16}$ to $10^{18}$ cm$^{-3}$, and that of a collector region is $10$ to $10^{16}$ cm$^{-3}$.

In this BPT, however, narrowing of a band gap occurs since the impurity concentration of the emitter region is high ($10^{19}$ cm$^{-3}$ or more). Therefore, an injection efficiency of carriers from the emitter to the base is sometimes decreased (i.e., the current gain $h_{FE}$ is decreased).

In addition, since the impurity concentration of the base is low, the BPT sometimes cannot normally operate at low temperatures (e.g., 77° K. or less).

In a BPT in which a junction is shallowed in order to increase a packing density, the impurity concentration of the base must be increased to prevent punchthrough between the emitter and the collector. In this case, however, a withstand voltage between the base and the emitter is decreased, and a capacitance between the base and the emitter is increased.

The potential barrier is formed not only in a valence band but also in a conduction band by the oxide film. Therefore, a flow of electrons as majority carriers in the emitter is blocked, and consequently, the current dependency of the current gain $h_{FE}$ has a gradient.

It is difficult to uniformly produce the natural oxide film. In addition, when the natural oxide film breaks down or is formed into balls by annealing, the base current changes. This phenomenon does not uniformly occur in individual BPTs to cause a variation, thereby varying the characteristics of the BPTs.

Especially in a linear IC, a photoelectric conversion apparatus (area sensor), a line sensor and the like in which a characteristic variation in individual BPTs is considered as a problem, the above phenomenon has a significant influence and therefore is considered as a serious problem.

In a photoelectric conversion apparatus using BPTs as sensor cells, a variation is a main cause of noise and therefore is a serious problem.

SUMMARY OF THE INVENTION

The present invention has been made to solve the above problems of the conventional techniques and has as its object to provide a semiconductor device which has a high current gain $h_{FE}$ and can be stably operated at low temperatures and a photoelectric conversion apparatus using the same.

It is another object of the present invention to provide a semiconductor device which does not pose a problem of a gradient in current dependency of a current gain or a characteristic variation and a photoelectric conversion apparatus using the same.

Still further object of the present invention is to provide a semiconductor device comprising an emitter of first conductivity type, a base of second conductivity type, and a collector of first conductivity type, wherein at least a vicinity of an interface of the emitter to base junction is formed by Si, polycrystalline or single crystalline $Si_{1-x}C_x$ ($x \leq 0.5$) is formed on a region formed by the Si of said emitter, and a junction between a region of the Si and a region of the polycrystalline and the single crystalline $Si_{1-x}C_x$ is a graded hetero junction.

Still further object of the present invention is to provide a semiconductor device comprising an emitter of first conductivity type, a base of second conductivity type, and a collector of first conductivity type, wherein at least a vicinity of an interface of emitter to base junction is formed by Si, polycrystalline or single crystalline $Si_{1-x}C_x$ ($x \leq 0.5$) is formed on a region of Si within said emitter, a junction between the region of Si and the region of polycrystalline or single crystalline $Si_{1-x}C_x$ is graded hetero junction, at least a portion under the region of Si within said emitter is formed by a single crystalline Si doped with B and Ge, and a concentration of B is no less than $1 \times 10^{18}$ cm$^{-3}$.

Still further object of the present invention is to provide a semiconductor device comprising an emitter of first conductivity type, a base of second conductivity type, and a collector of first conductivity type, wherein at least a portion of the emitter side at an emitter-base junction interface is formed by Si, a polycrystalline or a single crystalline $Si_{1-x}C_x$ ($x \leq 0.5$) is formed on a region formed by the Si of the emitter, at least a portion under the region formed by the Si of emitter is formed by $Si_{1-y}Ge_y$ ($0 < y < 1$), at least one of a junction between the region of Si and the region of polycrystalline or single crystalline $Si_{1-x}C_x$ and a junction between the region of Si and the region of $Si_{1-y}Ge_y$ is a graded hetero junction.

BRIEF DESCRIPTION OF THE DRAWINGS

FIG. 5 shows a potential configuration in a direction of depth along A—A' in FIG. 4;

FIG. 6 is an energy band diagram of n-n hetero junction;

DETAILED DESCRIPTION OF THE PREFERRED EMBODIMENTS

Preferred embodiments of the present invention will be described in detail below.

In order to solve the problems of the conventional BPT and achieve the above objects of the present invention, in a BPT according to the present invention, at least a region near a junction interface between the emitter and the base consists of Si, polycrystalline or monocrystalline $Si_{l-x}C_x$ ($x \leq 0.5$) is formed on the Si region of the emitter, and a junction between the Si region and the polycrystalline or monocrystalline $Si_{l-x}C_x$ region is a graded heterojunction.

In this BPT, at least a region below the Si region of the emitter preferably consists of monocrystalline Si doped with B and Ge.

Figure 1:
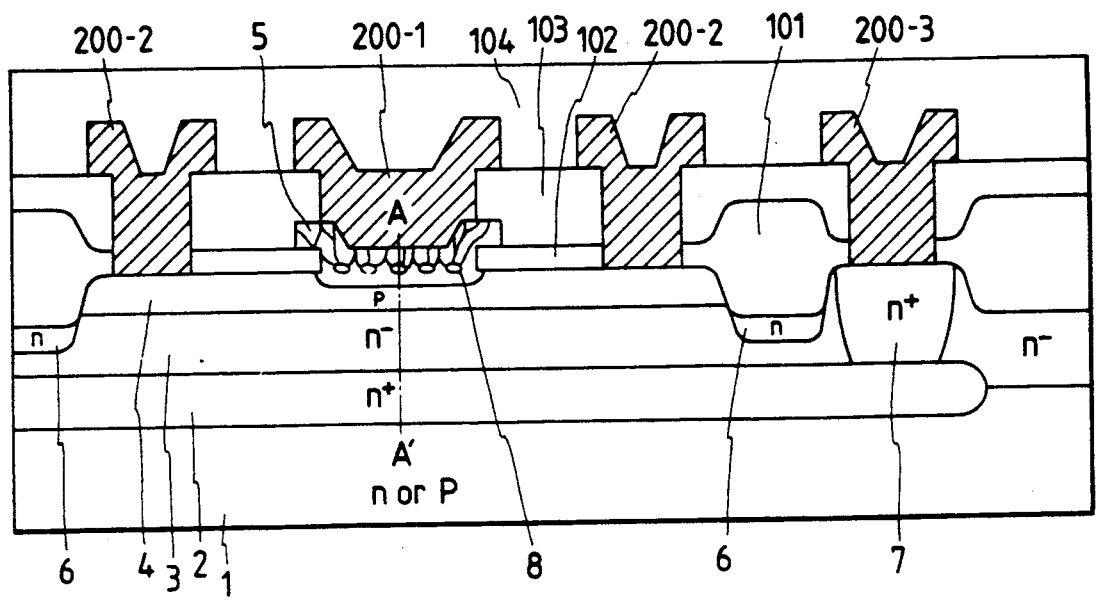
FIG. 1 is a schematic cross sectional view of a conventional bipolar transistor (BPT)
Figure 2:
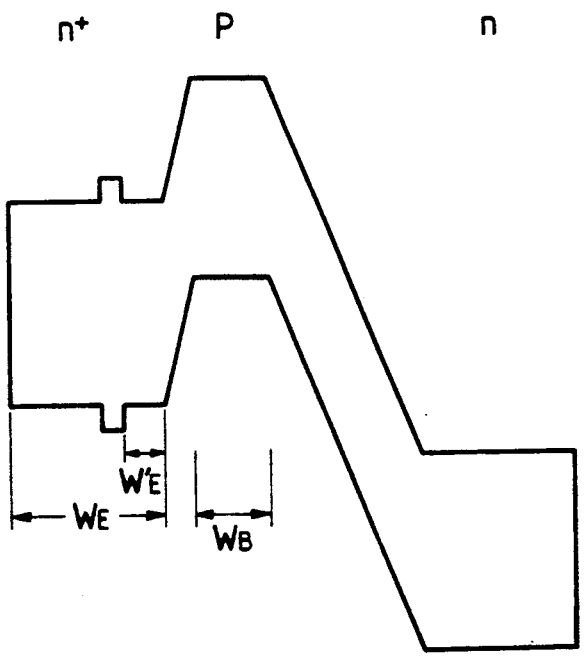
FIG. 2 shows a potential configuration in a direction of depth along A—A' in FIG. 1.
Figure 4:
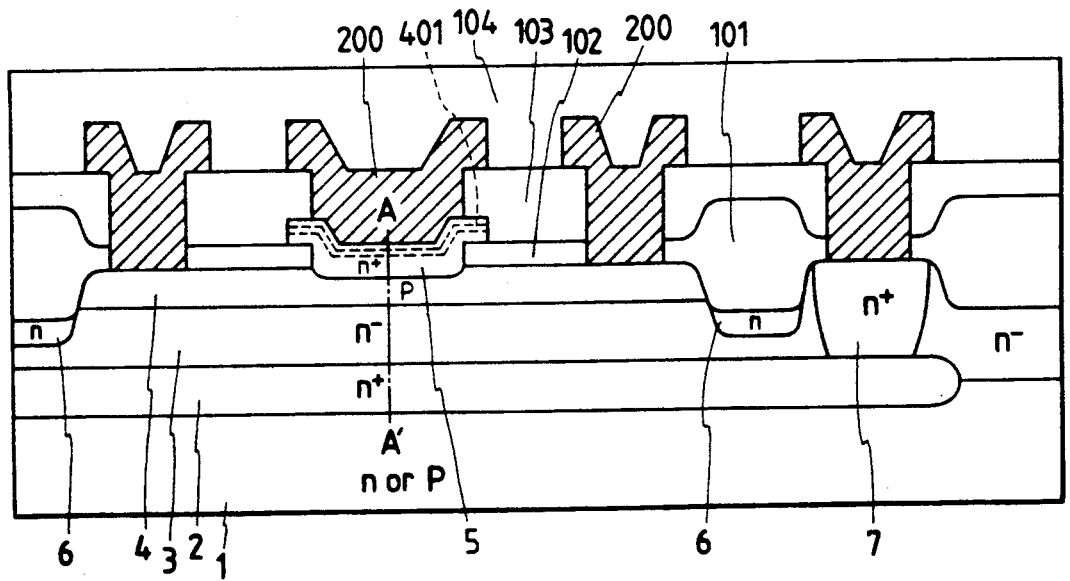
FIG. 4 is a schematic sectional view of a preferred embodiment of the present invention.

The $Si_{l-x}C_x$ region is an SiC region 401 shown in a schematic sectional view in FIG. 4 (in which the same reference numerals as in FIG. 1 denote the same parts).

The $Si_{l-x}C_x$ region can be formed by ion implantation.

A mixed crystal ratio x of $Si_{l-x}C_x$ is preferably $0.0125 \leq x \leq 0.5$, and more preferably, $0.0125 \leq x \leq 0.075$.

Doping of C, B and Ge can be performed by ion implantation.

A concentration of C in $Si_{l-x}C_x$ is preferably $6 \times 10^{20}$ cm$^{-3}$ or more.

An impurity concentration of the emitter is preferably $1 \times 10^{19}$ cm$^{-3}$ or less. Assuming that in polycrystalline or monocrystalline Si doped with B and Ge, a concentration of B is $N_B$ and that of Ge is $N_{Ge}$, $N_{Ge} > 8.25 N_B$ is preferred.

It is preferred to form a high-concentration impurity layer on the $Si_{l-x}C_x$ region of the emitter.

The high-concentration impurity layer preferably consists of $Si_{l-x}C_x$ ($x > 0.0125$).

The use of ion implantation is very preferable since doping of C, Ge and the like can be precisely performed and therefore mixed crystal components can be precisely set.

In particular, in the present invention, it is very important to form the $Si_{l-x}C_x$ region by ion implantation.

According to the present invention, the oxide film described above is removed, and the region containing carbon is formed in the emitter.

That is, in the present invention, the natural oxide film formed between the emitter and base regions is removed to remove the potential barrier at both the conduction band and valence band sides, and the region containing carbon is formed in the emitter, thereby forming a potential barrier at the valence band side.

According to the present invention, therefore, a characteristic variation between individual BPTs can be eliminated since no oxide film is present, and a current gain can be increased since the potential barrier is formed in the valence band.

In addition, in order to solve the above problems of the conventional techniques and achieve the above objects of the present invention, in a BPT according to the present invention, at least a region near a junction interface between the emitter and the base consists of Si, a polycrystalline or monocrystalline $Si_{l-x}C_x$ ($x \leq 0.5$) is formed on the Si region of the emitter, a neutral region of the base consists of polycrystalline or monocrystalline $Si_{l-y}Ge_y$ ($0 < y < 1$), and at least one of a junction between the Si region and the polycrystalline or monocrystalline $Si_{l-x}C_x$ region and a junction between the Si region and the $Si_{l-y}Ge_y$ region is a graded heterojunction.

Figure 12:
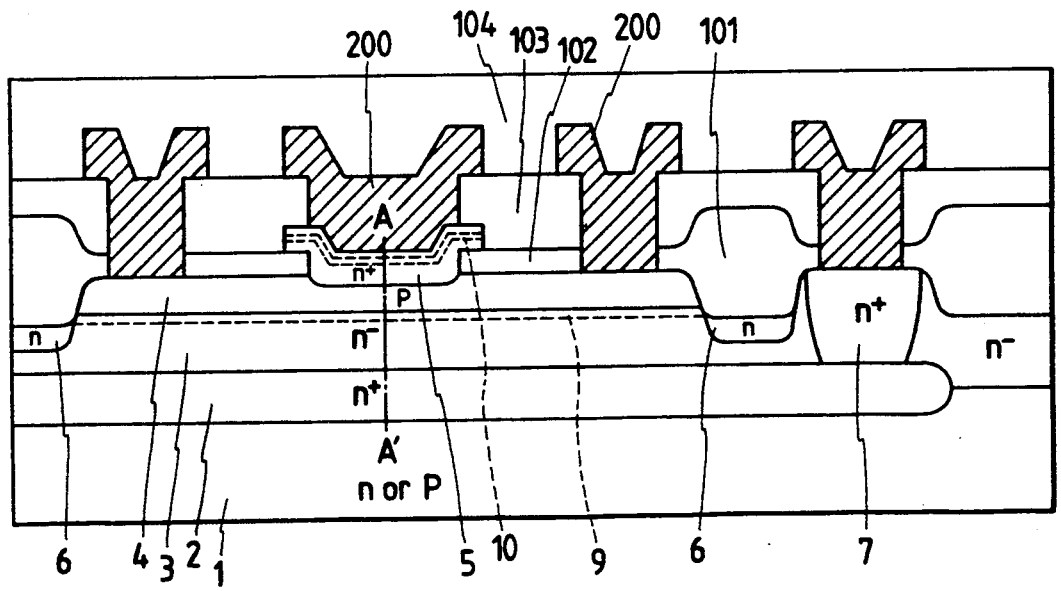
FIG. 12 is a schematic sectional view of another embodiment of the present invention.

A schematic sectional view of this arrangement is shown in FIG. 12 and will be described later.

At least one of the $Si_{l-x}C_x$ and $Si_{l-y}Ge_y$ regions is preferably formed by ion implantation.

A mixed crystal ratio x of C in $Si_{l-x}C_x$ is preferably $0.0125 \leq x \leq 0.075$.

A mixed crystal ratio y of Ge in $Si_{l-y}Ge_y$ is preferably $0.0625 \leq y \leq 0.375$.

The $Si_{l-y}Ge_y$ region is preferably, selectively formed only below the Si region of the emitter.

In the present invention, a silicon oxide film conventionally formed between the emitter and base regions is removed, the region ($Si_{l-x}C_x$ region) containing carbon is formed in the emitter region, and Ge is doped in at least the base region to form the $Si_{l-y}Ge_y$ mixed crystal region.

That is, in the present invention, the oxide film formed in the emitter region is removed to remove the above-mentioned potential barrier from both the conduction band and valence band sides, the region containing carbon is formed in the emitter to form a potential barrier at the valence band side, and the region consisting of $Si_{l-y}Ge_y$ mixed crystals is formed in the base to increase the number of carriers injected from the emitter to the base.

According to the present invention, therefore, a characteristic variation between individual BPTs can be eliminated since no oxide film is formed, and a current gain can be increased since the potential barrier is formed in the valence band and the number of carriers injected from the emitter to the base is increased.

The present invention will be described in detail below.

$Si_{l-x}C_x$ Region

According to the present invention, a potential barrier is formed in the emitter by forming an $Si_{l-x}C_x$ region to suppress diffusion of carriers injected from the base to the emitter, thereby decreasing the current $J_{B1}$ represented by equation 1-(1). That is, since $$\tanh (W_E'/L_p) = W_E'/L_p \ll 1$$

is established for $L_P \ll W_E'$, $J_{B1}$ can be decreased.

Embodiments of the present invention will be described in detail below.

$Si_{l-x}C_x$ Region

In the present invention, a potential barrier is formed by forming an $Si_{l-x}C_x$ region to suppress diffusion of carriers injected from the base to the emitter, thereby decreasing the base current $J_{B1}$ injected from the base to the emitter.

Analytical theoretical equations of base and collector currents obtained when the potential barrier is formed at only the valence band side are as follows.

That is, the base current mainly consists of a diffusion current of holes from the base to the emitter:

$$J_{B1} = (q \cdot n_i^2 \cdot D_p / N_E \cdot L_p) \times \tanh$$
$$(W_E'/L_p)[\exp(V_{BE}/kT) - 1]] \quad 2\text{-}(1)$$

(for $\Delta E_1 < < kT$), and a recombination current of electrons injected from the emitter:

$$J_{B2} = \{q \cdot n_i^2 \cdot D_n \cdot \exp(\Delta E_2 \cdot kT)/N_B \cdot L_n\} \times \quad 2\text{-}(2)$$
$$[\{\cosh(W_B/L_N) - 1\}/\{\sinh(W_B/L_N)\}] \times [\exp(V_{BE}/kT) - 1]$$

The collector current is represented by:

$$J_C = \{q \cdot n_i^2 \cdot D_n \cdot \exp(\Delta E_2 \cdot kT)/N_B \cdot L_n\} \times \quad 2\text{-}(3)$$
$$\{\cosech(W_B/L_N)\} \times \{\exp(V_{BE}/kT) - 1\}$$

where q is the electric charge, $n_i$ is the intrinsic semiconductor charge density (Si), $N_E$ is the impurity concentration of the emitter, $N_B$ is the impurity concentration of the base, $D_P$ is the diffusion coefficient of holes, $D_N$ is the diffusion coefficient of electrons, $L_P$ is the diffusion length ($\simeq (D_P \tau_P)^{\frac{1}{2}}$) of holes, $L_N$ is the diffusion length ($\simeq (D_N \tau_N)^{\frac{1}{2}}$) of electrons, k is the Boltzmann constant, T is the absolute temperature, and $V_{BE}$ is the base-emitter forward bias electron. Note that $\tau_P$ and $\tau_N$ represent minority carrier lifetimes of holes and carriers, respectively.

That is, in the present invention, since $$\tanh(W_E'/L_P) = W_E'/L_P < < 1 \quad 2\text{-}(4)$$

is established for $L_P > > W_E'$, $J_{B1}$ can be decreased. If $2W_E' > > L_P$ is satisfied, this effect is further enhanced. In the present invention, it is more preferred to form the emitter by monocrystals. If the emitter consists of polycrystals, $L_P$ is small, and the stability of characteristics is lower than that obtained by monocrystals due to a change in size of crystal grains or recrystallization caused by an annealing process.

Graded Heterojunction

A graded heterojunction (of a graded type) which is one feature of the present invention will be described.

When an amount of carbon to be ion-implanted in the emitter is increased and annealing is performed, SiC is formed. With a medium dose, SiC is represented by $Si_{l-x}C_x$ for $x \leq 0.5$. A voltage of about 2.1 eV is normally given to a forbidden band width of SiC. Neither of the conduction and valence bands of SiC coincide with those of Si. Therefore, SiC has both of a conduction band difference $E_C$ and a valence band difference $\Delta E_V$ with respect to Si.

Although various data are available, the values are assumed such that $\Delta E_C \simeq 0.3$ to 0.4 eV and $\Delta E_V \simeq 0.5$ to 0.6 eV. In a mixed crystal of Si and C, $\Delta E_C$ and $\Delta E_V$ gradually change approximately in proportion to x.

A case in which a junction is not a graded junction, i.e., a band is discontinuous will be described below. When the band is discontinuous, $\Delta E_C$ and $\Delta E_V$ have large influences on a carrier flow to interfere an emitter electron flow and holes injected from the base.

FIG. 6 is a band diagram of an n-n heterojunction obtained when a stepwise junction of n-Si and n-$Si_{l-x}C_x$ is formed. As shown in FIG. 6, a conduction band side discontinuity $\Delta E_C$ and a valence band side discontinuity $\Delta E_V$ occur.

Assuming that the band gap of n-$Si_{l-x}C_x$ is $E_{g1}$ and its Fermi level is $E_{F1}$, and the band gap of n-Si is $E_{g2}$ and its Fermi level is $E_{F2}$, the following equation is established:

$$E_{g1} - E_{g2} = \Delta E_C + \Delta E_V \quad 2\text{-}(5)$$

In the heterojunction, when the two constituting materials are isolated, electrons migrate from one having a higher Fermi level, and a depletion layer is formed in an interface therebetween. In order to simplify the explanation, assume that an energy difference from the conduction band $E_V$ to the Fermi level is the same in the two materials. In this case, a barrier height of electrons from the $Si_{l-x}C_x$ side in FIG. 6 is $\Delta E_C/2$. The thickness of the potential barrier depends of an impurity concentration. For example, when $x=0.5$, $l$ $\Delta E_C/2 = 0.15$ to 0.2 eV and therefore is a large obstacle for the emitter electron flow. Holes injected from the base are substantially perfectly blocked by a barrier substantially close to $\Delta E_V + \Delta E_C$.

In a graded heterojunction (of a graded type), however, a potential barrier in a conduction band is approximately represented by the following equation and is almost not problematic:

$$\Delta E_C(x) = (\Delta E_C/2) \times [1 + \tanh\{(x-x_O)/L\}] \quad 2\text{-}(6)$$

where $x_O$ is the center of a graded region and L is the effective length of the graded region.

Figure 7:
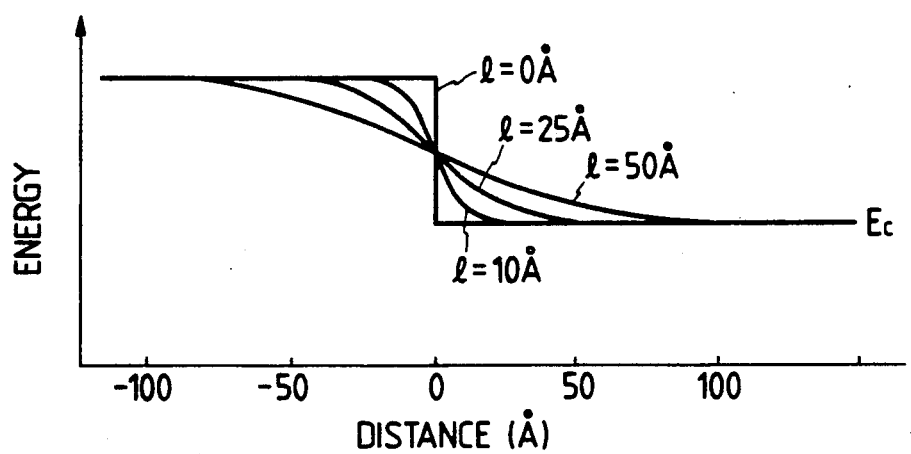
FIG. 7 is a graph showing an example of potential changing of a conduction band.

FIG. 7 is a graph showing changes in potential in the conduction band obtained when $L=0$, 10, 25 and 50 Å. As shown in FIG. 7, the band linearly changes when $L=50$ Å. In the present invention, since $C^+$ is ion-implanted, substantially the entire region becomes a graded region, and therefore no barrier is formed at the conduction band side.

The upper and lower limits of a C concentration will be described below.

The upper limit of C is a concentration for obtaining SiC. That is, if this concentration is represented by x, $x=0.5$. If this concentration is represented by a carbon concentration, a concentration of C is $5 \times 10^{22}$ cm$^{-3}$ since a concentration of Si is $5 \times$ cm$^{-3}$. If a larger amount of C is doped, excessive carbon is produced to degrade crystallinity. Note that $x \leq 0.075$ is more preferable for the following reason.

That is, when the C concentration becomes substantially the same as the Si concentration, polycrystals of SiC are produced inside. Before that, polycrystals of SiC are partially formed. Therefore, in order to reduce stress of $Si_{l-x}C_x$ for forming the emitter, a smaller amount of C is preferred in terms of crystallinity.

$\Delta E_g$ need only be about 0.1 eV. If $\Delta E_g = 0.1$ eV, $\exp(-0.1/kT) = 0.018$ and a passing ratio of electrons becomes about 2%. That is, if the mixed crystal ratio x of $Si_{l-x}C_x$ is $x \simeq 0.05$ or the peak value of C concentration is $2.5 \times 10^{21}$ cm$^{-3}$, satisfactory blocking power can be obtained. If $\Delta E_g$ of the hetero BPT is 0.15 or more, an ft characteristic is saturated. In view of this, $x \leq 0.075$ is preferred.

The lower limit of C is determined by the hole blocking power.

A probability of passing the potential barrier can be approximated by the following equation:

$$P(h) = \exp\{-(E_{g1} - E_{g2})/kT\} \quad 2\text{-}(7)$$

Therefore, if $E_{g1} - E_{g2} \geq kT$, the effect of the present invention can be obtained.

Since kT=0.025 eV at room temperature, the lower limit of x of $Si_{l-x}C_x$ is obtained as $x \cong 0.0125$ assuming that a band gap difference between SiC and Si is 1 eV. At a lower temperature, the lower limit of x is decreased in accordance with kT. The lower limit at room temperature represented by the C concentration is $C \geq 6 \times 10^{20}$ cm$^{-3}$.

A method of forming the $Si_{l-x}C_x$ region will be described below.

$Si_{l-x}C_x$ is preferably formed by ion-implanting C in Si.

When carbon is doped by ion implantation, a maximum concentration can be obtained at a portion having a predetermined depth from the surface and a concentration on the surface can be set to be low. Therefore, an ohmic resistance between the $Si_{l-x}C_x$ region and a metal electrode 200-1 can be set to be substantially the same as an ohmic resistance between Si and the metal electrode. For this purpose, the composition of $Si_{l-x}C_x$ on the surface need only satisfy $\Delta E_g < kT$. That is, if $x < 0.0125$ or less, an increase in ohmic resistance is not a problem.

Figure 8:
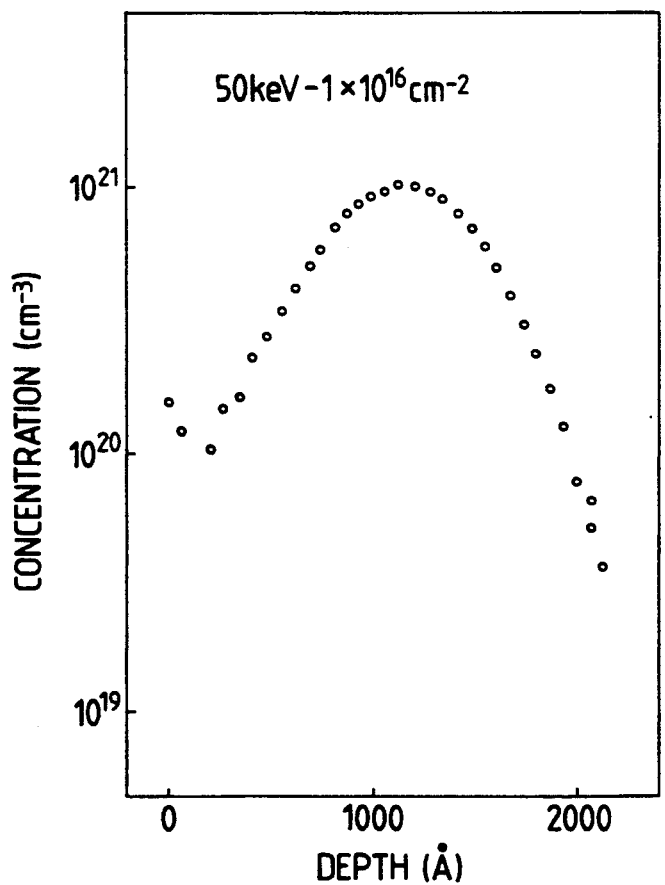
FIG. 8 shows SIMS analysis.

FIG. 8 is a graph showing a result obtained by ion-implanting C$^+$ at 50 kV and a dose of $1 \times 10^{16}$ cm$^{-2}$ and analyzing a concentration by using an SIMS. As shown in FIG. 8, C has a peak concentration of $1 \times 10^{21}$ cm$^{-3}$ at a portion having a depth of about 1,000 Å from the surface and a width of 2,000 Å. Since the C concentration on the surface is about 1/10 the peak concentration, the surface layer is very close to Si. For example, if x=0.1 at the peak concentration, x is about 0.01 on the surface.

Impurity Concentration of Emitter

A desired impurity concentration of the emitter is $1 \times 10^{19}$ cm$^{-3}$ or less in order to prevent band gap narrowing.

Band gap narrowing will be described first.

In an n-type semiconductor having a high impurity concentration, the width of a donor level is widened to be connected as a donor band to a conduction band of the semiconductor in terms of energy, thereby forming a degenerate conduction band. As a result, band end tailing occurs to change the band gap from $E_g$ to $E_g'$, thereby causing band gap narrowing of $\Delta E_g = E_g - E_g'$.

In high-concentration doping of a p-type semiconductor, similar band tailing occurs in the valence band to cause narrowing of a band width (forbidden band width) $E_g$. The value of band narrowing can be approximately represented by the following equation:

$$\Delta E_g = (3q^2/16\pi\epsilon_s) \times (q^2 N/\epsilon_s kT)^{\frac{1}{2}} \quad 2\text{-}(8)$$

where q is the electric charge, $\epsilon_s$ is the semiconductor permittivity, k is the Boltzmann constant, T is the absolute temperature, and N is the impurity concentration.

If a semiconductor is Si and a temperature is room temperature, the following equation is obtained:

$$\Delta E_g = 22.5(N/10^{18})^{\frac{1}{2}} meV \quad 2\text{-}(9)$$

Therefore, if $N = 1 \times 10^{18}$ cm$^{-3}$, $\Delta E_g = 22.5$ meV is obtained. Assuming that a carrier concentration obtained when no band gap narrowing occurs is $n_i^2$, an effective carrier concentration $n_i'^2$ obtained when narrowing occurs is given as follows:

$$n_i'^2 = n_i^2 exp(\Delta E_g/kT) \quad 2\text{-}(10)$$

In order to prevent such band gap narrowing, it is preferred to limit the impurity concentration of the emitter. This will be described in detail below.

The lower limit of the impurity concentration of the emitter will be described first.

As described above, the collector current is represented by equation 2-(6), and the following equation is established for $W_B << L_n$ and $V_{BE} >> kT$:

$$J_C = \{(q \cdot n_i^2 \cdot D_n)/(N_B \cdot W_B)\} exp(V_{BE}/kT) \quad 2\text{-}(11)$$

This equation is normally established within the range in which the following minority carrier approximation is established:

$$N_D >> (n_i^2/N_B) exp(V_{BE}/kT) \quad 2\text{-}(12)$$

(where $N_D$ is the impurity concentration of the emitter). A region in which the above equation is not established is the current drive limit of the transistor.

Therefore, the following equation obtained by substituting $(n_i^2/N_B)exp(V_{BE}/kT)$ with the emitter concentration $N_D$ represents the current drive limit for defining the emitter concentration of the transistor:

$$J_C \approx q \cdot (D_n/W_B) \cdot N_D \quad 2\text{-}(13)$$

In a normal transistor, $1 \times 10^4$ to $10^5$ A/cm$^2$ is required as $J_C$.

Figure 10:
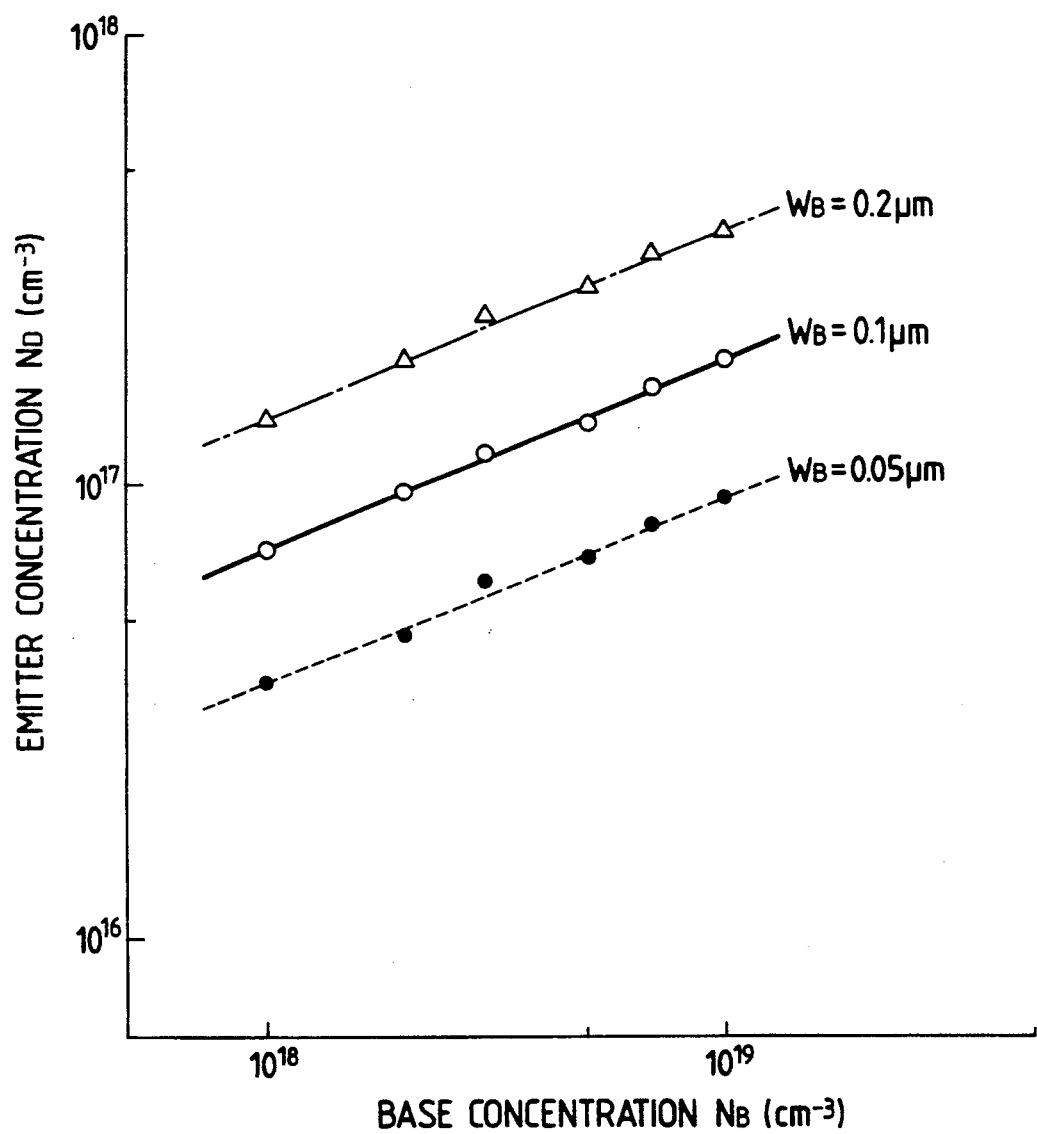
FIG. 10 shows a relation between the base and emitter concentrations at each base thickness.

Since $D_n = (kT/q)\mu_n$, $D_n$ is calculated by using conventional data as $\mu_n$, and the lower limit of $N_B$ is calculated for $W_B = 0.05$, 0.1 and 0.2 $\mu$m. As a result, a graph shown in FIG. 10 is obtained.

In an integrated circuit, a withstand voltage of at least 2 V or more is required. For the sake of safety, it is preferred to set a higher concentration than the lower limit of the impurity concentration of the emitter obtained when an application voltage across the emitter and the base is 3 V and electric field $\epsilon = 1$ MV/cm. This is because when an emitter size is decreased (e.g., $3 \times 3$ $\mu m^2$) and the depth of an emitter junction is decreased (e.g., 0.5 $\mu$m or less) in an actual semiconductor device or the like, a current is increased by an influence of a current around the emitter.

The upper limit of the impurity concentration of the emitter will be described.

A maximum electric field (stepwise junction approximation) $\epsilon_m$ and a depletion layer width W of a p-n junction can be represented by the following equations:

$$\epsilon_m = [\{2q(V_{bi}+V)/\epsilon_s\}\{(N_B \cdot N_D)/(N_B+N_D)\}]^{\frac{1}{2}} \quad 2\text{-}(14)$$

$$\epsilon_m = [\{2\epsilon_s/q\}\{(N_B \cdot N_D)/(N_B+N_D)\}\{V_{bi}+V\}]^{\frac{1}{2}} \quad 2\text{-}(15)$$

where $V_{bi}$ is the diffusion potential, $\epsilon_s$ is the permittivity, $N_B$ is the base concentration, $N_D$ is the emitter concentration, and V is the application voltage.

Figure 11:
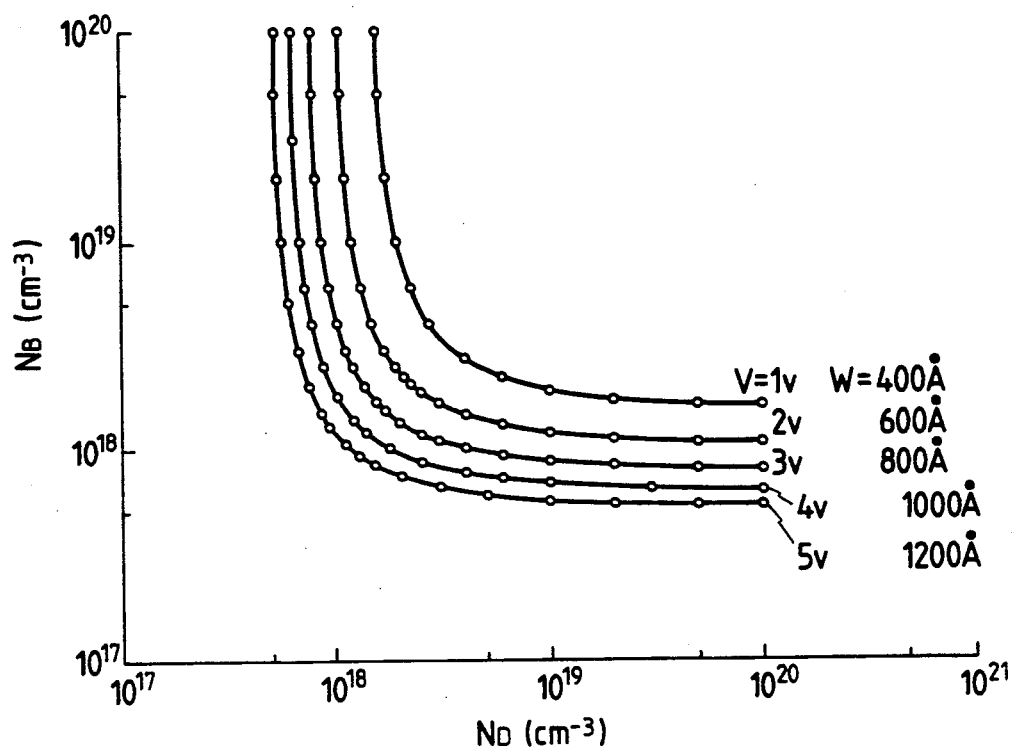
FIG. 11 shows a relation between the base and emitter concentration for particularly designed dielectric constant.

FIG. 11 is a graph showing a relationship between the base concentration $N_B$ and the emitter concentration $N_D$ obtained when $\epsilon_m = 1$ MV/cm for application voltage V=1, 2, 3, 4, and 5. For example, when the application voltage is 3 V or more, the emitter concentration is preferably $4.5 \times 10^{18}$ cm$^{-3}$ or less for the base concentration of $1 \times 10^{18}$ cm$^{-3}$. The concentration is preferably $1 \times 10^{18}$ cm$^{-3}$ or less for the base concentration of $5 \times 10^{18}$ cm$^{-3}$ and is preferably $9 \times 10^{17}$ cm$^{-3}$ or less for the base concentration of $1 \times 10^{19}$ cm$^{-3}$. When the base concentration is $1 \times 10^{18}$ cm$^{-3}$ or more, the emitter concentration is preferably $4.5 \times 10^{18}$ cm$^{-3}$ or less, and this is the preferable upper limit.

When the application voltage is 2.5 V and $\epsilon_m = 1$ MV/cm, the emitter concentration is preferably $1 \times 10^{19}$ cm$^{-3}$, and this is the preferable upper limit.

Base Impurity Concentration

An impurity concentration of boron (B) will be described.

In the present invention, the concentration of B in the base is increased to cause band gap narrowing, thereby increasing an injection efficiency of carriers from the emitter and preventing freezing of the carriers at a low temperature.

In equation 2-(5) described above, the term exp($\Delta E_g/kT$) indicates a band gap narrowing effect obtained by increasing the impurity concentration of the base. It is apparent from the equation that $J_{B2}$ is increased when $\Delta E_g > kT$. In this case, since $kT = 25$ meV at room temperature, the base concentration need only be $N_B > 1 \times$ cm$^{-3}$ in accordance with equation 2-(2).

By increasing the concentration of the base as described above, an injection efficiency of carriers from the emitter can be increased, and freezing of the carriers at a lower temperature can be prevented.

The reason for adopting B as an impurity is as follows.

Figure 9:
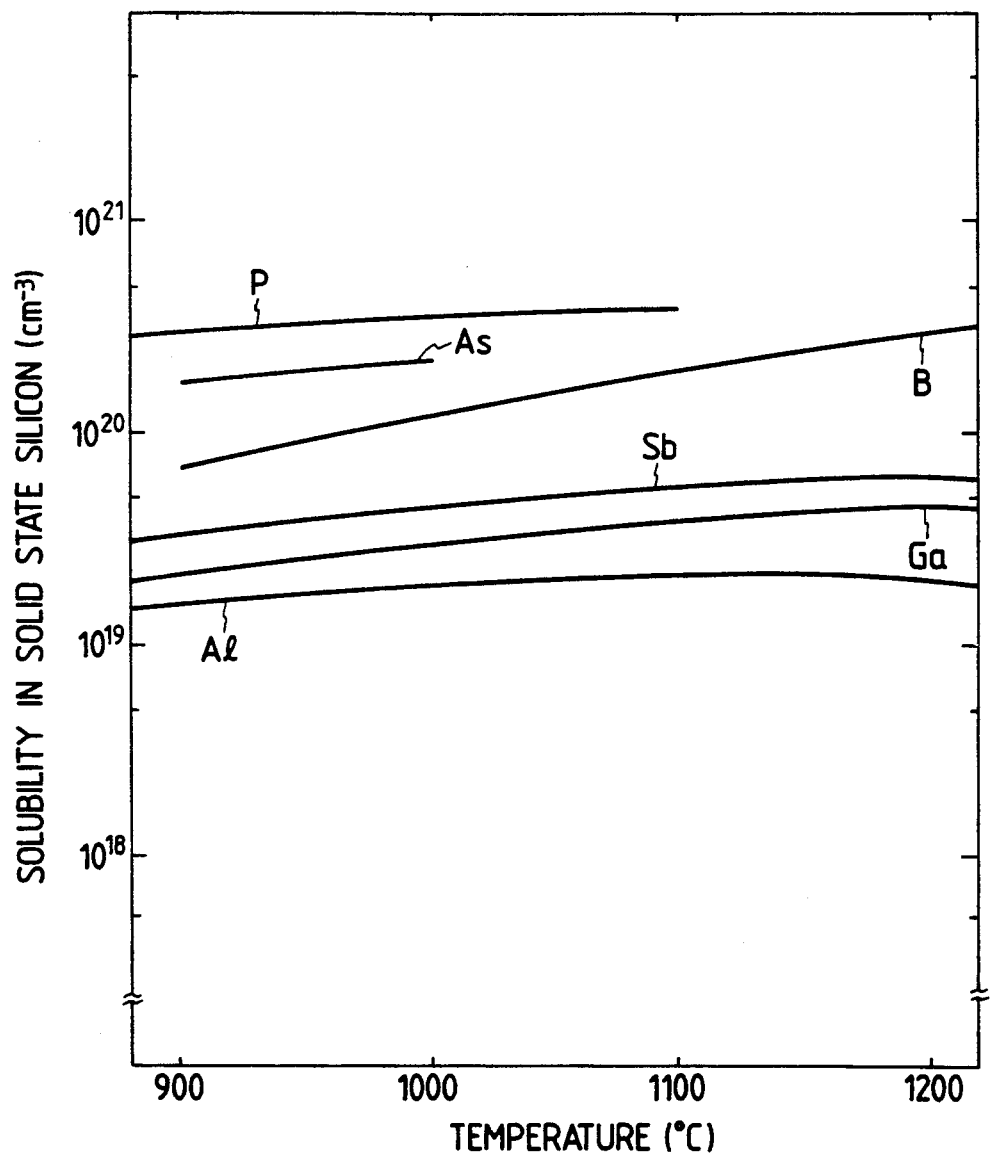
FIG. 9 is a graph showing a solid-state solubility of an impurity in a silicon.

That is, a p-type impurity has lower solubility in silicon than that of phosphorus (P) or arsenic (As) as an n-type impurity. FIG. 9 shows data of solubility of an impurity in solid state silicon. Referring to FIG. 9, the abscissa indicates a temperature (T° C.), and the ordinate indicates the solubility in a solid state. Although B, Ga and Al are available as a p-type impurity, B can be dissolved at a highest concentration. If an impurity is doped at a solid solution degree or more, the impurity precipitates in Si to cause a defect in a semiconductor device manufacturing process, thereby adversely affecting the characteristics of a BPT. Note that this phenomenon depends on the temperature of the process.

For the above reason, B which can be most stably doped at a high concentration is optimal as a p-type impurity.

In the present invention, Ge can be doped in the base region simultaneously with B.

Doping of Ge is performed to narrow the band gap.

Ge has a narrower band gap than that of Si. While the band gap of Si is $E_{gSi} \approx 1.1$ eV, that of Ge is $E_{gGe} \approx 0.7$ eV. A crystal composition of Si$_{1-x}$Ge$_x$ is approximately represented by the following equation:

$$E_g' = E_{gSi} - X(E_{gSi} - E_{gGe}) \qquad 2\text{-}(16)$$

Therefore, if $X = 0.1$, $\Delta E_g$ ($= E_g' - E_{gSi}$) is about 20 meV.

The concentration limit of Ge will be described.

In the present invention, the concentration of Ge is preferably 8.25 times or more the concentration of B. This reason will be described below.

When an impurity is doped at a high concentration, a tetrahedral atomic radius of the impurity in Si is important. That is, since Si has a diamond crystal, a tetrahedral bond is formed, and an atomic radius r of the bond is important. An atomic radius difference represented by $100 \times (r_{Ge} - r_{Si})/r_{Si}$ is about $-25$ when B is used.

$100 \times (r_{Ge} - r_{Si})/r_{Si}$ of Ge is about $+4$, i.e., larger than that of Si by 4%. Ideally, when a dose of Ge is 25/4 = 8.25 times that of B, a lattice strain can be perfectly corrected.

In the present invention, however, since a p-type region of the base can have an impurity concentration distribution by, e.g., ion implantation, a structure not easily producing the lattice strain can be manufactured. Therefore, the concentration of Ge need not be limited as described above. Therefore, in order to narrow the band gap, the dose of Ge is preferably 8.25 times or more that of B.

Si$_{1-y}$Ge$_y$ Region

A mixed crystal of silicon (Si) and germanium (Ge) in the base region described above will be described in detail below.

Each of Si and Ge is a perfect solid solution having the same diamond crystal, and a perfect diamond crystal is obtained for each of y ($0 < y < 1$) of Si$_{1-y}$Ge$_y$.

Figure 13:
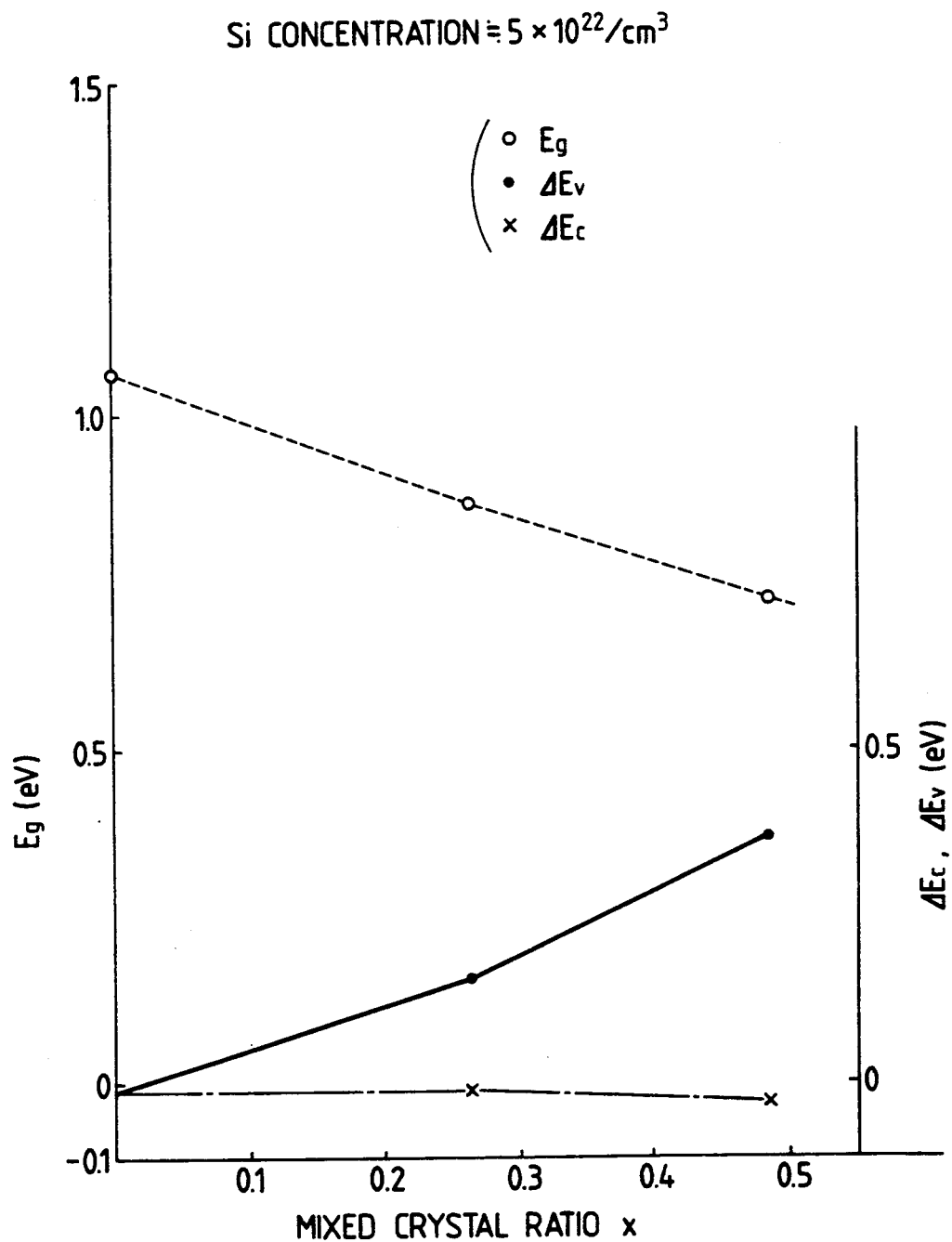
FIG. 13 shows an energy band gap relating to a ratio between a silicon and germanium.

The forbidden band width $E_g$ is approximately 1.1 eV in a crystal consisting of only Si and is approximately 0.7 eV in a crystal consisting of only Ge. The forbidden band width $E_g$ of the Si$_{1-y}$Ge$_y$ mixed crystal changes as y increases as shown in FIG. 13. Referring to FIG. 13, the abscissa indicates a mixed crystal ratio y, the ordinate indicates the forbidden band width $E_g$, the reduction width $\Delta E_c$ at the conduction band side and the reduction width $\Delta E_v$ at the valence band side. As is apparent from FIG. 6, reduction in forbidden band width of the Si$_{1-y}$Ge$_y$ mixed crystal upon increase in y mostly occurs in the valence band. Therefore, since no electron barrier for electrons injected from the emitter is present and no band discontinuity is formed as in the case of Si$_{1-x}$C$_x$ and Si, the number of electrons injected from the emitter to the base can be increased.

When the Si$_{1-y}$Ge$_y$ mixed crystal is used, a difference in lattice constant between Si and Ge is a problem. The lattice constant of Si is $d_{Si} = 5.43086$ Å, and that of Ge is $d_{Ge} = 5.65748$ Å, providing a difference of about 4% as described above. Therefore, when Si$_{1-y}$Ge$_y$ is formed on Si, stress is naturally produced, and dislocation occurs when the stress is significant.

Figure 14:
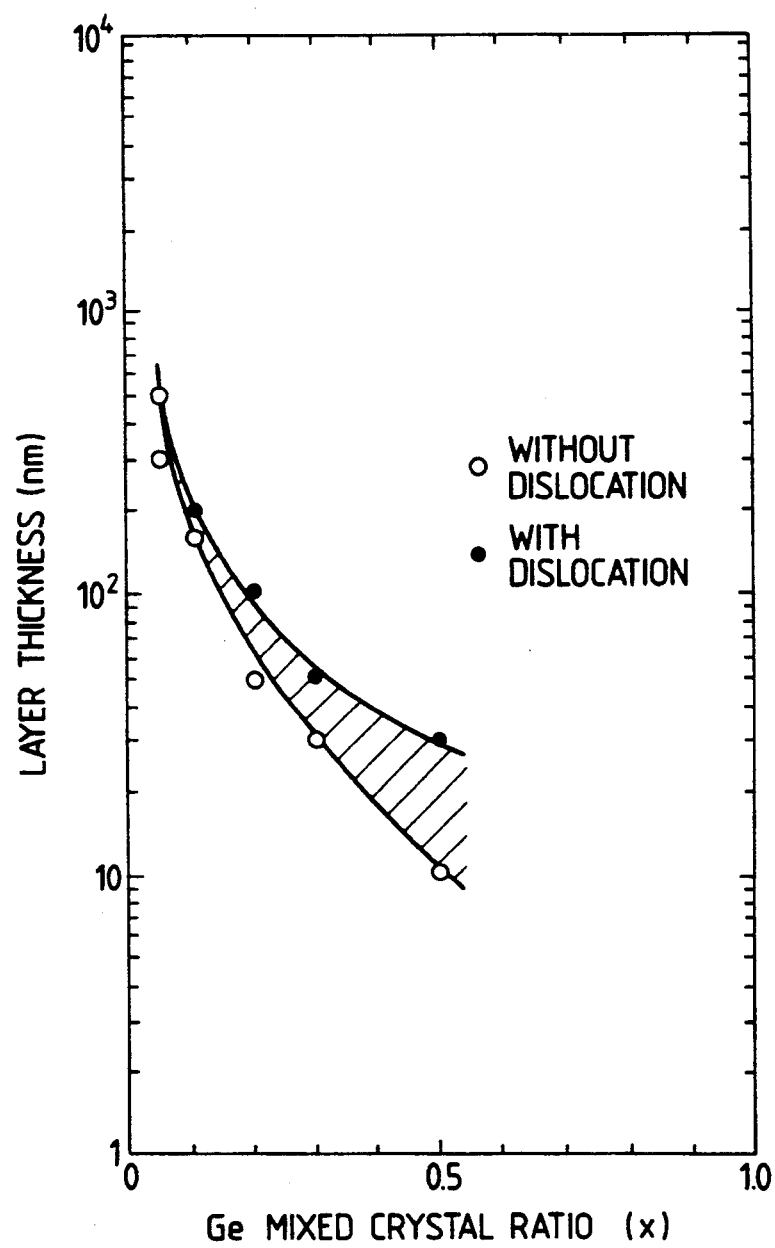
FIG. 14 shows a ratio between the silicon and the germanium and a transition.

A predetermined relationship is present between the mixed crystal ratio y of the Si$_{1-y}$Ge$_y$ mixed crystal and the thickness which does not cause dislocation. FIG. 14 shows a relationship between the mixed crystal ratio y of Si$_{1-y}$Ge$_y$ indicated by the abscissa and "with dislocation" (symbol o) plus "without dislocation" (symbol o) indicated by the ordinate. This data indicates results obtained by checking Si$_{1-y}$Ge$_y$ deposited on an Si substrate by a molecular beam epitaxial method (MBE method). In a layer having a uniform mixed crystal ratio y, dislocation occurs in the interface unless the layer thickness is smaller than a hatched region in FIG. 14. Note that since the data is obtained by performing epitaxial growth at 510° C., the thickness of a transition region from Si$_{1-y}$Ge$_y$ to Si is very small, i.e., 50 Å or less. In the present invention, a stepwise graded heterojunction is formed in this region to solve the problem of dislocation.

The mixed crystal ratio of Si$_{1-y}$Ge$_y$ will be described below.

The mixed crystal ratio y of Si$_{1-y}$Ge$_y$ is preferably a value for obtaining $\Delta E_2 \approx kT$ by an effect of exp($\Delta E_2/kT$) of equation 2-(12).

For example, when the device is to be used at room temperature, y is preferably 0.0625 or more since $\Delta E_2 = 0.025$ eV.

The mixed crystal ratio y is preferably 0.5 or and more preferably, 0.375 or less.

The mixed crystal ratio y is preferably 0.5 or less because $y \leq 0.5$ and $t \leq 100$ Å are preferred to obtain hetero BPT characteristics without causing lattice strain in accordance with the relationship between the Ge mixed crystal ratio y and the critical thickness t shown in FIG. 14.

Figure 15:
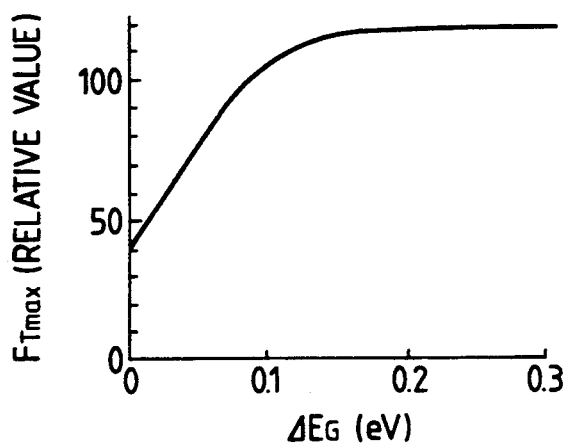
FIG. 15 shows a relation between $\Delta E_G$ and $E_{Tmax}$.

The mixed crystal ratio y is more preferably 0.375 or less on the basis of a graph showing a relationship between $\Delta E_g$ and $F_{Tmax}$ shown in FIG. 15. Referring to FIG. 15, $F_{Tmax}$ is not improved even when $\Delta E_g \geq 0.15$ eV. Therefore, $\Delta E_g \leq 0.15$ eV is sufficient. When $\Delta E_g \leq 0.15$ eV, the mixed crystal ratio $y \leq 0.375$.

For these reasons, $0.0625 \leq y \leq 0.375$ is an optimal range of y.

A method of forming the $Si_{1-y}Ge_y$ will be described below.

$Si_{1-y}Ge_y$ is preferably formed by ion-implanting Ge in Si.

Figure 16:
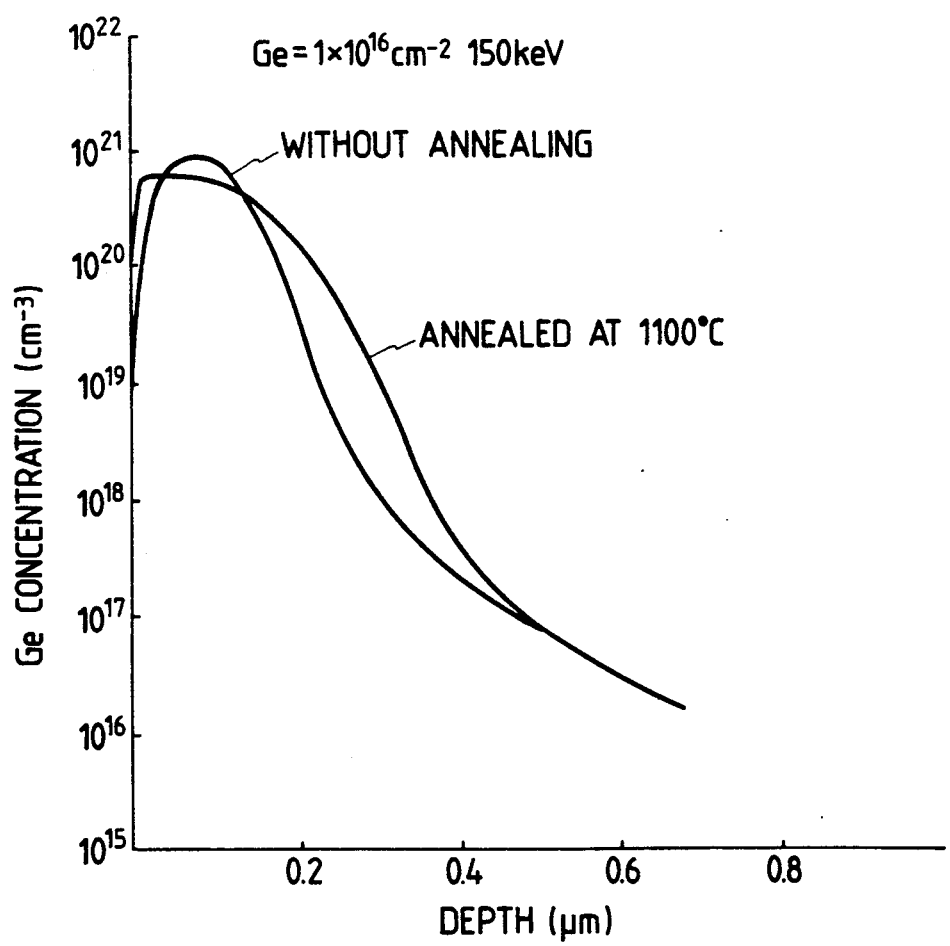
FIG. 16 shows a SIMS analysis.

FIG. 16 shows results obtained by ion-implanting Ge+ at 150 keV and a dose of $1 \times 10^{16}$ cm$^{-2}$ and analyzing by using an SIMS for a case without annealing and a case with annealing at 1,100° C. for four hours.

As is apparent from FIG. 16, the peak concentration in Si is present around 0.1 μm. When annealing is performed at 1,100° C. for four hours, a flat portion is widened to facilitate formation of the base.

A distribution function of the Ge concentration with respect to a depth direction x in the semiconductor upon ion implantation is approximately represented by the following relation:

$$N(x) \approx (N_0/2.5R_P)\exp-\{(x-R_P)^2/\Delta R_P\} \quad (14)$$

where $N_0$ is the implantation amount per unit area, $R_P$ is the peak position, and $\Delta R_P$ is the distance from the peak to unit diffusion amount (1δ). $R_P$ and $\Delta R_P$ change in accordance with an application voltage.

Monocrystal and Polycrystal

Although the emitter may consist of monocrystalline Si or polycrystalline Si, it preferably consists of monocrystalline Si. This is because when the emitter consists of monocrystals, the diffusion length $L_P$ of holes is increased to increase a diffusion current of the holes from the base to the emitter, thereby increasing the current gain ($h_{FE}=J_C/(J_{B1}+J_{B2})$). In addition, the grain size of crystal grains of polycrystalline Si differs in accordance with the formation conditions to cause a variation in BPT characteristics. Monocrystalline Si does not pose such a problem.

EMBODIMENTS

Embodiment 1

FIG. 4 is a view showing a semiconductor device according to an embodiment of the present invention. Referring to FIG. 4, the same reference numerals as in FIG. 1 denote the same parts. The semiconductor device according to this embodiment differs from the conventional semiconductor device shown in FIG. 1 in that an emitter region 5 consists of monocrystals and carbon (C) is ion-implanted to form an $Si_{1-x}C_x$ region 10.

FIG. 5 is a view showing a potential upon normal operation in the depth direction of a section A—A' of the semiconductor device shown in FIG. 4. FIG. 5 shows a thickness $W_E$ of an emitter neutral region and a thickness $W_B$ of a base neutral region. As shown in FIG. 5, a potential barrier is present at a position indicated by $W_E'$.

A BPT manufacturing process according to this embodiment will be described below.

(1) As, Sb, P or the like is ion-implanted and impurity diffusion is performed to form an n+-type buried region 2 (impurity concentration = $1 \times 10^{16}$ to $10^{19}$ cm$^{-3}$) in a p- or n-type substrate 1.

(2) An n -type region 3 (impurity concentration = $1 \times 10^{14}$ to $10^{17}$ cm$^{-3}$) is formed by an epitaxial technique or the like.

(3) An n+-type region 7 (impurity concentration = $1 \times 10^{17}$ to $10^{20}$ cm$^{-3}$) for decreasing a collector resistance is formed.

(4) A channel stopper 6 is formed by ion implantation.

(5) An element isolation region 101 is formed by a selective oxidation method, a CVD method or the like.

(6) B, BF$_2$, Ga or the like is ion-implanted to form a base region 4 (impurity concentration = $1 \times 10^{16}$ to $10^{19}$ cm$^{-3}$) (For example, B+ is ion-implanted at a dose of $3 \times 10^{14}$/cm$^2$ and 40 keV and annealed at 900° C. for 20 minutes by using N$_2$.)

(7) An emitter contact is formed in an oxide film 102 to form an emitter region 5 so as not to form a thin oxide film. For example, after the surface is cleaned in an H$_2$ atmosphere at 900° C. and a reduced pressure of 10 Torr, an epitaxial layer 5 is formed in an SiH$_2$Cl$_2$+H$_2$ atmosphere at 850° C. to 900° C. and 50 Torr.

(8) Carbon (concentration = $1 \times 10^{16}$ cm$^{-3}$) is ion-implanted with 50 keV, and annealing is performed at 1,000° C. for about 20 minutes to perform recrystallization. Thereafter, phosphorus serving as a dopant for the emitter is ion-implanted with a dose of $5 \times 10^{15}$ cm$^{-2}$ and 60 keV to pattern the emitter region 5.

(9) After additional annealing is performed, an insulating film 103 is deposited and a contact opening is formed.

(10) Al-Si for forming as an electrode 200 is sputtered and patterned.

(11) After the Al-Si electrode is alloyed, a passivation film 104 is formed.

The BPT shown in FIG. 4 was manufactured by the process having the above steps. In the present invention, most important steps are step (7) of forming a high-quality monocrystalline Si emitter and step (8) of ion-implanting C in the emitter to form an $Si_{1-x}C_x$.

Since a diffusion coefficient $D_C$ of C in Si is smaller than a diffusion coefficient $D_P$ of phosphorus, i.e., $D_C < D_P$, a profile is not largely disturbed after ion implantation of carbon, but P is uniformly diffused in Si and $Si_{1-x}C_x$ to form the emitter. In addition, crystal recovery after C is ion-implanted in Si occurs at 900° C. or more. Even if a temperature is 1,000° C. or more, however, since C has a different lattice constant from that of Si and SiC has a different crystal structure, Si and $Si_{1-x}C_x$ are crystallized while producing stress in a region having a low concentration of C. When the C concentration becomes substantially the same as the Si concentration, polycrystals of SiC are produced inside. In an intermediate state between these two states, polycrystals of SiC are partially formed in an atomic scale. Therefore, a small amount of C is preferred in order to reduce the stress of $Si_{1-x}C_x$ for forming the emitter.

A value of about 0.1 eV is sufficient as $\Delta E_g$. When $\Delta E_g = 0.1$ eV, $\exp(-0.1/kT) = 0.018$ is obtained, and a passing ratio of electrons becomes about 2%. That is, when $x \approx 0.05$ (represented by x in $Si_{1-x}C_x$) or $C \approx 2.5 \times 10^{21}$ cm$^{-3}$ (a peak value represented by a C concentration), sufficient inhibiting power can be obtained. If $\Delta E_g$ of the hetero BPT is 0.15, an ft characteristic is saturated. In view of this, therefore, $x \leq 0.075$ is most preferred.

When carbon is doped by ion implantation, a maximum concentration can be set at a portion having a predetermined concentration from the surface, and a concentration on the surface can be reduced. Therefore, an ohmic resistance with respect to the metal electrode 200 can be set to be the same as that of Si. The composition of $Si_{1-x}C_x$ on the surface need only satisfy $\Delta E_g < kT$. Therefore, if $x < 0.0125$ or less (represented by x in $Si_{1-x}C_x$), an increase in ohmic resistance is not a problem.

FIG. 5 shows an analysis result of a concentration distribution obtained by an SIMS when C$^+$ is ion-implanted at 50 kV and a dose of $1 \times 10^{16}$ cm$^{-2}$. As shown in FIG. 5, a peak concentration of $10^<$cm$^{-3}$ is present at a portion having a depth of about 1,000 Å from the surface and a width of about 2,000 Å. Since the surface concentration is about 1/10 the peak concentration, the composition of the surface layer is very close to Si. If $x = 0.1$ is obtained at the peak concentration, $x =$ about 0.01 is obtained on the surface.

A distribution of ion implantation in the depth direction is approximately represented by the following equation:

$$N(x) \approx \{N_o/(2.5\Delta R_p)\} \times exp[\{-(x-R_p)/\Delta R_p^2\}] \quad (12)$$

where $N_o$ is the ion implantation amount (cm$^{-2}$), $R_P$ is the peak depth, and $\Delta R_P$ is the diffusion width of ions.

According to the BPT of this embodiment, the current gain can be increased, and variations in individual BPTs can be reduced.

Embodiment 2

Figure 17:
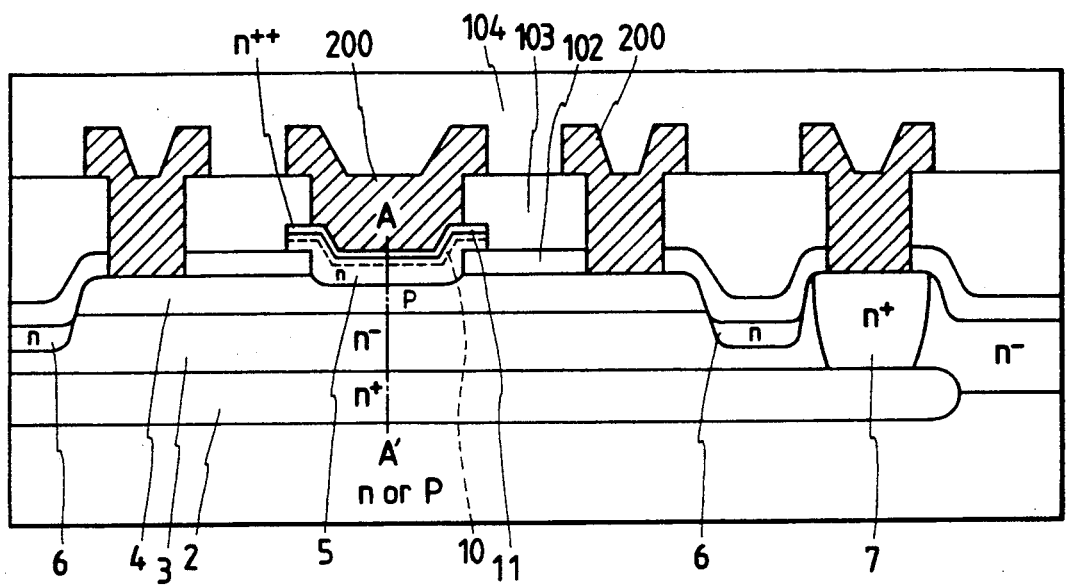
FIG. 17 is a schematic sectional view of further embodiment of the present invention.

FIG. 17 is a view showing another embodiment of the present invention.

A BPT according to this embodiment differs from that of Embodiment 1 in that an n$^{++}$-type layer having a higher impurity concentration than that of an emitter region 5 is formed in a region having a small amount of C. This layer is formed to decrease an ohmic resistance with respect to a metal electrode 200, thereby increasing an operation speed of the BPT.

Embodiment 3

Figure 19:
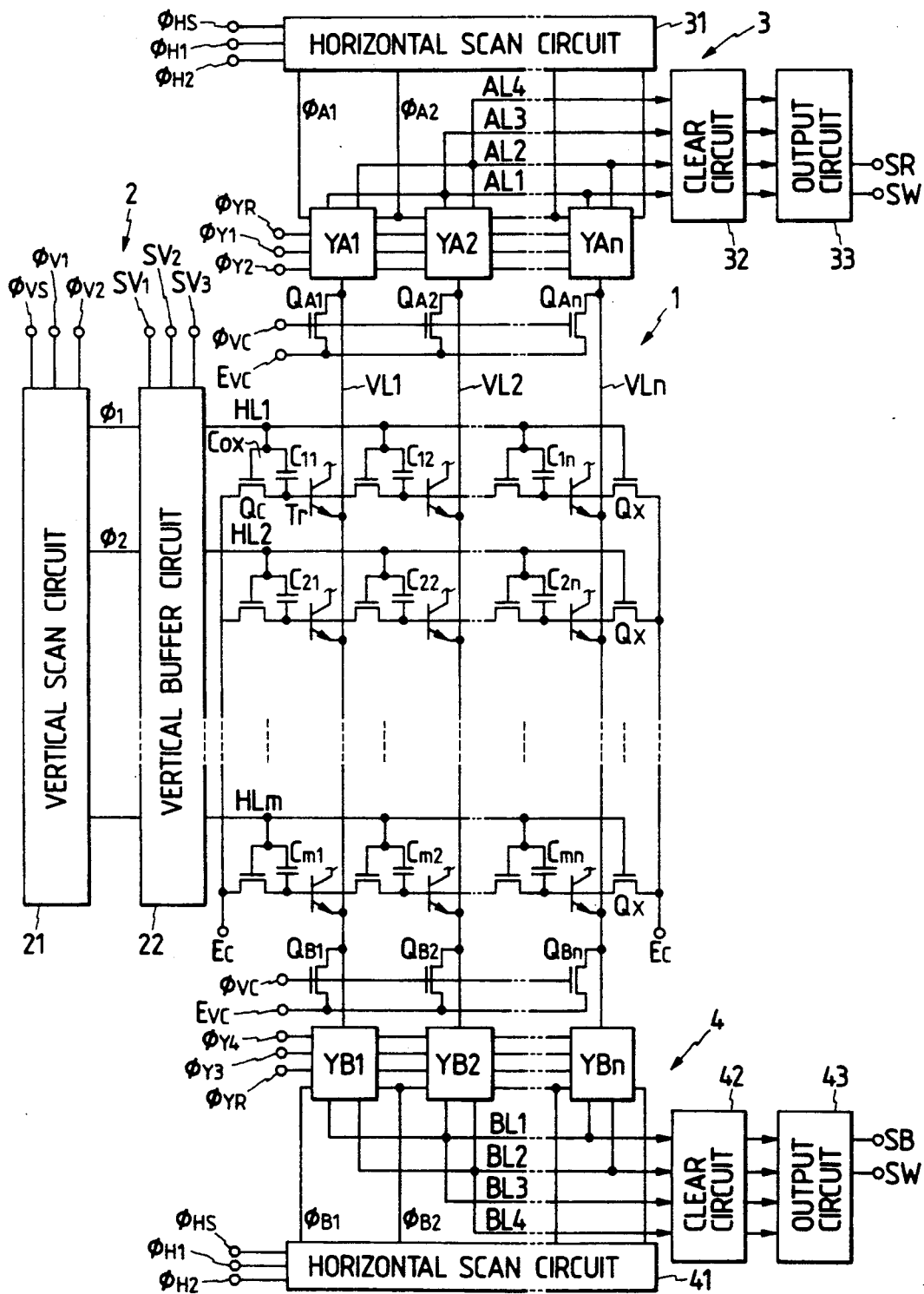
FIG. 19 is a circuit diagram of a solid-state image pick-up apparatus using the BPT according to the present invention.

FIG. 19 is a circuit diagram showing a solid state imaging apparatus using the BPT in Embodiment 1. Referring to FIG. 19, the BPT described in Embodiment 1 is used in a portion denoted by Tr.

That is, in this embodiment, the BPT is used as a photoelectric conversion element.

When an area sensor shown in FIG. 19 is used as a color camera, for example, optical information of the same photoelectric conversion element is read a plurality of times. In this case, since the same element is subjected to a read operation a plurality of times, a ratio of an electric output upon first read operation with respect to that upon second and subsequent read operations. If this ratio is small, correction must be performed.

Assuming that the ratio between the first and second read outputs is defined as a nondestructive degree, this nondestructive degree is represented by the following equation:

nondestructive
degree $= (C_{tot} \times h_{FE})/(C_{tot} \times h_{FE} + C_v)$ where $C_{tot}$ is the total capacitance connected to the base of the photoelectric conversion element indicated by Tr in FIG. 17 and is determined by a base-emitter capacitance $C_{be}$, a base-collector capacitance $C_{bc}$ and $C_{ox}$, and $C_v$ is the floating capacitance of a read line represented by $VL_1, \ldots, VL_n$. Note that $C_{ox}$ may not be present in accordance with the type of circuit system.

The nondestruction degree can be easily improved by increasing $h_{FE}$. That is, the nondestruction degree could be increased by using the BPT of Embodiment 1 capable of increasing $h_{FE}$.

In this embodiment, the present invention is applied to an area sensor. It is obvious, however, that the present invention can be applied to a line sensor.

Embodiment 4

FIG. 4 is a schematic sectional view showing a semiconductor device according to still another embodiment of the present invention. Although not shown, the device according to this embodiment differs from that of Embodiment 1 in that a base region 4 consists of Si-B-Ge. Referring to FIG. 4, the same reference numerals as in FIG. 1 denote the same parts. The semiconductor device according to this embodiment differs from conventional semiconductor devices in the following points.

(1) An $Si_{1-x}C_x$ region 10 is formed by ion-implanting C.

(2) An impurity concentration of the emitter is $1 \times 10^{19}$ cm$^{-3}$ or less so that almost no band gap narrowing occurs at least near the interface with respect to the base.

(3) A base region 4 is formed by using Si-B-Ge, and an impurity concentration of the base region is set to be about $10^{18}$ to $10^{21}$ cm$^{-3}$ to cause band gap narrowing.

A high-concentration layer having a concentration of about $10^{18}$ to $10^{21}$ cm$^{-3}$ is preferably formed on the surface of the emitter region 5 in order to decrease an ohmic resistance between the emitter and the electrode.

Figure 20:
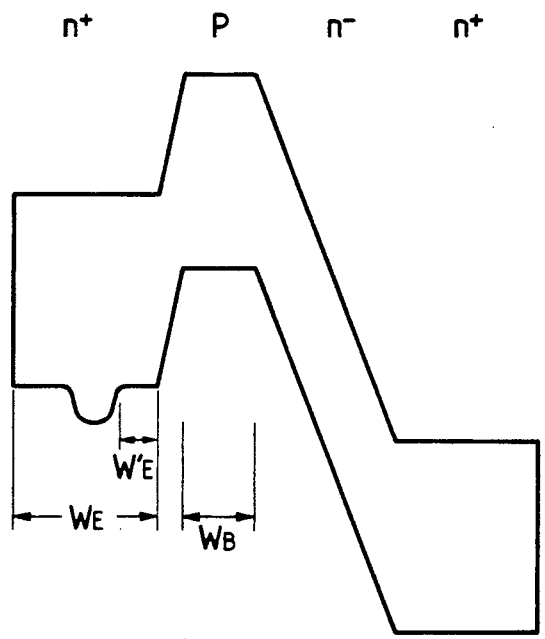
FIG. 20 shows a potential configuration in a direction of depth along A—A′ in FIG. 4 according to another embodiment of the present invention.

FIG. 20 is a view showing a potential upon normal operation in the depth direction of a section A—A' of the semiconductor device according to this embodiment shown in FIG. 4. FIG. 20 shows a thickness $W_E$ of an emitter neutral region, a distance $W_E'$ between a potential barrier in the emitter and a junction surface, a thickness $W_B$ of a base neutral region, a band gap $E_{g1}$ of Si, a band gap $E_{g2}$ of $Si_{1-x}C_x$, and a band gap $E_{g3}$ of the base causing band narrowing. $E_{g1}$, $E_{g2}$ and $E_{g3}$ satisfy relations of $\Delta E_1 = E_{g2} - E_{g1}$ and $\Delta E_2 = E_{g1} - E_{g3}$.

A BPT manufacturing process according to this embodiment will be described below.

(1) As, Sb, P or the like is ion-implanted and impurity diffusion is performed to form an n$^+$-type buried region 2 (impurity concentration $= 1 \times 10^{16}$ to $10^{19}$ cm$^{-3}$) in a p- or n-type substrate 1.

(2) An n$^-$-type region 3 (impurity concentration $= 1 \times 10^{14}$ to $10^{17}$ cm$^{-3}$) is formed by an epitaxial technique or the like.

(3) An n$^+$-type region 7 (impurity concentration $= 1 \times 10^{17}$ to $10^{20}$ cm$^{-3}$) for decreasing a collector resistance is formed.

(4) A channel stopper 6 is formed by ion implantation.

(5) An element isolation region 101 is formed by a selective oxidation method, a CVD method or the like.

(6) After Ge is ion-implanted in a base region 4 at a concentration of $5 \times 10^{16}$ cm$^{-3}$ and 150 keV, annealing is performed at 1,050° C. for 30 minutes.

(7) B, BF$_2$ or the like is ion-implanted (for example, BF$_2^+$ is ion-implanted at a dose of $1 \times 10^{14}$/cm$^2$ and 30 keV), and annealing is performed at 800° C. for 20 minutes by using N$_2$, thereby forming a base region 4.

(8) An emitter contact is formed in an oxide film 102 to form an emitter region 5 so as not to form a thin oxide film. In this embodiment, after the surface is cleaned in an H$_2$ atmosphere at 900° C. and a reduced pressure of 10 Torr, the emitter layer 5 is formed in an SiH$_2$Cl$_2$+H$_2$ atmosphere at 850° C. to 900° C. and 50 Torr by epitaxial growth.

(9) Carbon (concentration=$1 \times 10^{16}$ cm$^{-2}$) is ion-implanted at 50 keV, and annealing is performed at 1,000° C. for about 20 minutes to perform recrystallization. Thereafter, phosphorus serving as a dopant for the emitter is ion-implanted at a dose of $5 \times 10^{15}$ cm$^{-2}$ and 60 keV to pattern the emitter region 5.

(10) After additional annealing is performed, an insulating film 103 is deposited and a contact opening is formed.

(11) Al-Si for forming an electrode 200 is sputtered and patterned.

(12) After the Al-Si electrode is alloyed, a passivation film 104 is formed.

The BPT shown in FIG. 4 was manufactured by the process having the above steps. In the present invention, most important steps are steps (6) and (7) of forming Si-B-Ge, step (8) of forming a high-quality monocrystalline Si emitter and step (9) of ion-implanting C in the emitter to form an Si$_{l-x}$C$_x$ mixed crystal.

The above manufacturing steps will be described in detail below.

Although Si is in an amorphous state after Ge is implanted in step (6), crystal recovery can be easily, solid-state-epitaxially performed by annealing at 900° C. or more. In addition, a diffusion constant of Ge in Si is small and a concentration profile is substantially not changed upon annealing at 1,000° C. or less. In step (6), therefore, a distribution of Ge is determined by performing annealing at 1,050° C. for 30 minutes, and a process temperature is set at 1,000° C. or less in the subsequent annealing step so as not to change the Ge distribution.

It is very important to form the emitter region 5 so as not to form a thin oxide film in step (8), and this step has a large effect on the characteristics of the hetero BPT.

In step (8), diffusion of the p-type region of the base occurs unless monocrystals or polycrystals are deposited at a temperature of 1,000° C. or less. The p-type impurity must be shallower than or at the same level as the Ge region.

Step (9) will be described below.

Since a diffusion coefficient D$_C$ of C in Si is smaller than a diffusion coefficient D$_P$ of phosphorus, i.e., D$_C$<D$_P$, a profile is not largely disturbed after ion implantation of carbon, but P is easily, uniformly diffused in Si and Si$_{l-x}$C$_x$ to form the emitter. Crystal recovery after C is ion-implanted in Si occurs at 900° C. or more. Therefore, ion implantation is preferably performed at 1,000° C. or more.

The characteristic of the current gain h$_{FE}$ of the above BPT was measured. As a result, h$_{FE}$ was significantly increased.

Embodiment 5

FIG. 17 is a schematic sectional view showing still another embodiment of the present invention. Similar to Embodiment 4, a base region of this embodiment differs from that of Embodiment 2.

The semiconductor device according to this embodiment differs from that according to Embodiment 1 in that an n$^+$-type layer 11 for reducing an ohmic resistance is formed in a region having a low concentration of C of an Si$_{l-x}$C$_x$ region 10.

With this structure, an ohmic contact can be perfectly the same as that of Si.

In this embodiment, the n$^+$-type layer is formed in the Si$_{l-x}$C$_x$ region 10. The structure, however, may be modified such that after the Si$_{l-x}$C$_x$ region 10 is formed, the n$^+$-type layer is formed thereon by LPCVD or the like.

Embodiment 6

FIG. 17 is a circuit diagram showing a solid state imaging apparatus using the hetero BPT according to Embodiment 4. Referring to FIG. 17, the hetero BPT described in Embodiment 4 is used in a portion represented by Tr.

That is, in this embodiment, the hetero BPT is used as a photoelectric conversion element.

Since the present invention can improve f$_T$ (frequency) of a semiconductor device, it can be very effectively applied to a photoelectric conversion apparatus.

f$_T$ of a photoelectric conversion apparatus is determined by a read speed.

A current photoelectric conversion apparatus (area sensor) has $500 \times 640$ elements. An HD (High Division; an area sensor for high vision) has $1,000 \times 2,000$ elements. In an operation of a current television, a horizontal scanning time is HT≅50 μsec, and a horizontal blanking period HALK is 8 to 10 μsec. In the HD, HT=3 to 3.7 μsec, and HBLK=26 μsec. While a horizontal scanning time is conventionally TH=50 μsec/640=80 nsec, that of the HD is TH=26 nsec/2,000=13 nsec.

The frequency must be at least six times. That is, since a current frequency is f$_T$≅1 to 2 GHz, it must be f$_T$≧6 to 16 GHz or more.

For the above reason, ΔE$_g$ is preferably 0.15 eV or less.

The area sensor using a photoelectric conversion element having the BPT arrangement of Embodiment 4 was used as a color camera.

As described above, a nondestruction degree can be easily improved by increasing h$_{FE}$. That is, the nondestruction degree can be increased by using the BPT arrangement of Embodiment 4 capable of increasing h$_{FE}$.

In the area sensor for the HD, C$_{tot}$=10 fF, and C$_v$=2.5 PF. Therefore, in order to obtain a nondestruction degree of 0.90 or more, for example, h$_{FE}$ of 2,250 or more is required. In order to assure a sufficient nondestruction degree, h$_{FE}$ must be 2,000 or more.

To the contrary, in a conventional homojunction BPT, for example, no sufficient nondestruction degree can be obtained since h$_{FE}$ is at most 1,000. In the semiconductor device of the present invention, however, a high nondestruction degree can be obtained since h$_{FE}$ can be sufficiently increased.

More preferably, the nondestruction degree is 0.98 or more. In this case, h$_{FE}$ must be about 10,000. This value cannot be achieved by a conventional hetero or homo BPT but can be achieved only by the hetero BPT of the present invention.

In this embodiment, the present invention is applied to an area sensor. It is obvious, however, that the present invention can be applied to a line sensor.

Embodiment 7

FIG. 12 is a schematic sectional view showing a semiconductor device according to still another embodiment of the present invention. Referring to FIG. 12, the same reference numerals as in FIG. 1 denote the same parts. The semiconductor device according to this embodiment differs from the conventional semiconductor device shown in FIG. 1 in that no silicon oxide is formed between emitter and base regions, an $Si_{1-x}C_x$ region 10 is formed by ion-implanting C, and a base region 4 and a portion 9 of a collector region near an interface with the base region consist of a mixed crystal of Si and Ge.

Figure 3:
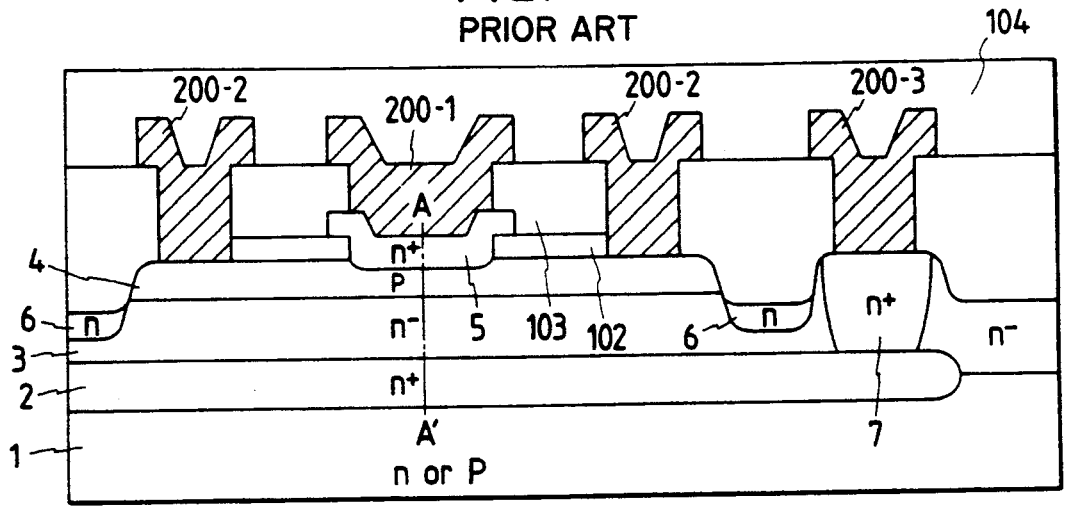
FIG. 3 is a schematic sectional view of a conventional bipolar transistor (BPT)

FIG. 5 is a view schematically showing a potential upon normal operation in the depth direction of a section A—A' of the semiconductor device of this embodiment shown in FIG. 12. FIG. 12 shows a thickness $W_E$ of an emitter neutral region, a thickness $W_B$ of a base neutral region, a band gap $E_{g1}$ of Si, a band gap $E_{g2}$ of $Si_{1-x}C_x$, and a band gap $E_{g3}$ of $Si_{1-y}Ge_y$. $E_{g1}$, $E_{g2}$ and $E_{g3}$ satisfy relations of $\Delta E_1 = E_{g2} - E_{g1}$ and $\Delta E_2 = E_{g1} - E_{g3}$. As shown in FIG. 3, a potential barrier is present in a position indicated by $W_E'$.

A BPT manufacturing process according to this embodiment will be described below.

(1) As, Sb, P or the like is ion-implanted and impurity diffusion is performed to form an n+-type buried region 2 (impurity concentration = $1 \times 10^{16}$ to $10^{19}$ cm$^{-3}$) in a p- or n-type substrate 1.

(2) An n⁻-type region 3 (impurity concentration = $1 \times 10^{14}$ to $10^{17}$ cm$^{-3}$) is formed by an epitaxial technique or the like.

(3) An n+-type region 7 (impurity concentration = $1 \times 10^{17}$ to $10^{20}$ cm$^{-3}$) for decreasing a collector resistance is formed.

(4) A channel stopper 6 is formed by ion implantation.

(5) An element isolation region 101 is formed by a selective oxidation method, a CVD method or the like.

(6) After Ge is ion-implanted in a base region 4 at a concentration of $5 \times 10^{16}$ cm$^{-3}$ and 150 keV, annealing is performed at 1,050° C. for 30 minutes.

(7) B, BF$_2$, Ga or the like is ion-implanted (for example, B+ is ion-implanted at a dose of $3 \times 10^{14}$/cm$^2$ and 30 keV), and annealing is performed at 900° C. for 20 minutes by using N$_2$, thereby forming a base region 4.

(8) An emitter contact is formed in an oxide film 102 to form an emitter region 5 so as not to form a thin oxide film. In this embodiment, after the surface in an H$_2$ atmosphere at 900° C. and 10 Torr, the emitter layer 5 is formed in an SiH$_2$Cl$_2$ + H$_2$ atmosphere at 850° C. to 900° C. and 50 Torr by epitaxial growth.

(9) Carbon (concentration = $1 \times 10^{16}$ cm$^{-3}$) is ion-implanted at 50 keV, and annealing is performed at 1,000° C. for about 20 minutes to perform recrystallization. Thereafter, phosphorus serving as a dopant for the emitter is ion-implanted at a dose of $5 \times 10^{15}$ cm$^{-2}$ and 60 keV to pattern the emitter region 5.

(10) After additional annealing is performed, an insulating film 103 is deposited and a contact opening is formed.

(11) Al-Si for forming an electrode 200 is sputtered and patterned.

(12) After the Al-Si electrode is alloyed, a passivation film 104 is formed.

The BPT shown in FIG. 12 was manufactured by the process having the above steps. In the present invention, most important steps are step (6) of forming $Si_{1-y}Ge_y$, step (8) of forming a high-quality monocrystalline Si emitter and step (9) of ion-implanting C in the emitter to form an $Si_{1-x}C_x$ mixed crystal.

The above manufacturing steps will be described in detail below.

Although Si is in an amorphous state after Ge is implanted in step (6), crystal recovery can be easily, solid-state-epitaxially performed by annealing at 900° C. or more. In addition, a diffusion constant of Ge in Si is small and a concentration profile is substantially not changed upon annealing at 1,000° C. or less. In step (6), therefore, a distribution of Ge is determined by performing annealing at 1,050° C. for 30 minutes, and a process temperature is set at 1,000° C. or less in the subsequent annealing step so as not to change the Ge distribution.

It is very important to form the emitter region 5 so as not to form a thin oxide film in step (8), and this step has a large effect on the characteristics of the hetero BPT.

In step (8), diffusion of the p-type region of the base occurs unless monocrystals or polycrystals are deposited at a temperature of 1,000° C. or less. The p-type impurity must be shallower than or at the same level as the Ge region.

Step (9) will be described below.

Since a diffusion coefficient $D_C$ of C in Si is smaller than a diffusion coefficient $D_P$ of phosphorus, i.e., $D_C$ $D_P$, a profile is not largely disturbed after ion implantation of carbon, but P is easily, uniformly diffused in Si and $Si_{1-x}C_x$ to form the emitter. Crystal recovery after C is ion-implanted in Si occurs at 900° C. or more. Therefore, ion implantation is preferably performed at 1,000° C. or more.

The characteristic of the current gain $h_{FE}$ of the above BPT was measured. As a result, $h_{FE}$ was significantly increased.

Embodiment 8

Figure 21:
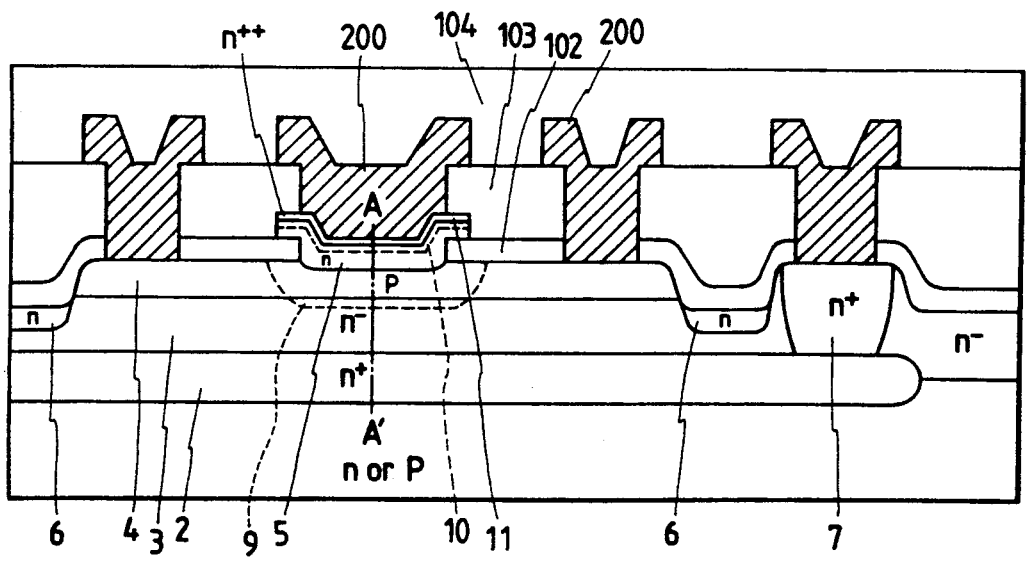
FIG. 21 is a schematic sectional view of still further embodiment of the present invention.

FIG. 21 is a schematic sectional view showing still another embodiment of the present invention.

A BPT according to this embodiment differs from that of Embodiment 7 in that an $Si_{1-y}Ge_y$ region 9 is formed only below an emitter region 5 and an n++-type layer 11 is formed on an emitter surface.

According to this embodiment, since a potential barrier is formed in the lateral direction of the emitter, an injected current to the base in the lateral direction of the emitter can be reduced, thereby further increasing the current gain $h_{FE}$.

The reason why $h_{FE}$ can be increased by this embodiment will be described in detail below.

Figure 18:
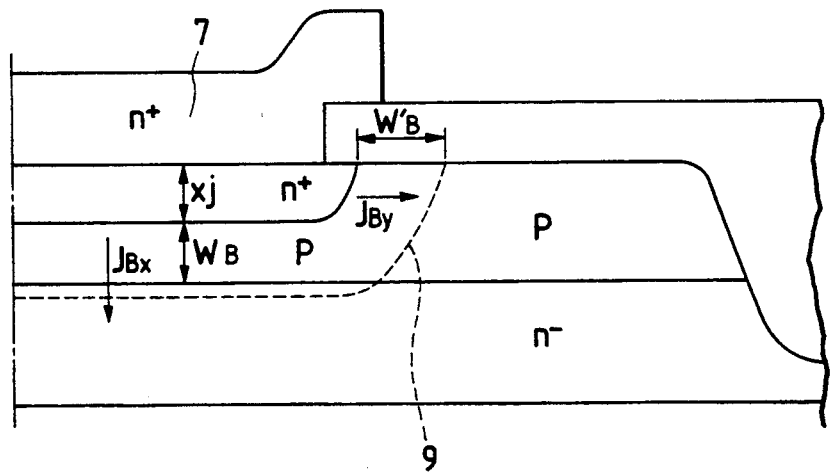
FIG. 18 is an enlarge partial sectional view of an emitter portion of BPT in FIG. 21.

FIG. 18 is an enlarged schematic sectional view showing the emitter portion of the BPT shown in FIG. 21. FIG. 18 shows a depth $x_h$ of the emitter in a substrate, a vertical base width $W_B$, and a distance $W_B'$ to the potential barrier. As shown in FIG. 18, a base current $J_B$ can be divided into a lateral component $J_{Bx}$ and a vertical component $J_{By}$. Of these components, the lateral component $J_{Bx}$ reduces $h_{FE}$.

Assuming that carriers are perfectly blocked by this potential barrier, $J_{Bx}$ can be represented as follows:

$$J_{BX} = \{q \cdot n_i^2 \cdot D_n exp(\Delta E_g/kT)/N_B \cdot L_n\} \times \tanh (W_B'/L_N)\{exp(V_{BE}/kT) - 1\} \quad (15)$$

Assuming that an emitter area is $A_E$ and an emitter peripheral length is $L_E$, $h_{FE}$ is represented by the following equation:

$$h_{FE} = A_E J_C/(A_E J_{By} + L_E X_j J_{Bx}) \quad (16)$$

Since $L_E X_j$ is negligible when the peripheral length is not important, $h_{FE}$ is determined as $h_{FE} = J_C/J_{By}$. In a micropatterned BPT, however, $L_E X_j$ becomes substantially the same as $A_E$ and therefore can no be negligible. For example, assuming that $X_j = 0.3$ μm and $A_E = 1 \times 1$ μm$^2$, $X_j L_E/A_E = 1.2$ is obtained. In this manner, in a micropatterned BPT, $h_{FE}$ has a very large influence.

A ratio of $J_{Bx}$ to $J_{By}$ is approximated as follows for $L_n \gg W_B$ and $L_n \gg W_B'$:

$$J_{Bx}/J_{By} \simeq \pi W_B'/W_B \quad (17)$$

That is, a current density in the lateral direction is larger than that in the vertical direction. In a BPT having no potential barrier, since $J_{Bx}/J_{By} \simeq 2(L_n/W_B)$ is established and a relationship between $L_n$ and $W_B$ is normally $L_n \simeq W_B$, a lateral current density is large.

As in this embodiment, however, when a potential barrier is formed in the lateral direction and the emitter is formed to satisfy a relation of $A_E = L_{Ex}^2$, $h_{FE}$ is represented by the following equation:

$$\begin{aligned} h_{FE} &= (J_C/J_{By})[1/\{(8X_j/L_{Ex})(W_B'/W_B)\}] \\ &= h_{FEO}\{1/(8X_j/L_{Ex})(W_B'/W_B)\} \end{aligned} \quad (18)$$

That is, $h_{FE}$ becomes much smaller than $h_{FEO}$ determined by a BPT structure in the vertical direction. In order to reduce an influence of the lateral current, the following relation must be satisfied:

$$(8X_j/L_{Ex})(W_B'/W_B) \leq 1 \quad (19)$$

For example, when $W_B' = W_B$ and $L_{Ex} = L_{nm}$, $X_j$ is obtained as $X_j \leq 0.125$ μm. This effect is very important when an emitter size is small. In a conventional BPT having no potential barrier, $h_{FE}$ cannot be increased since $W_B'$ is replaced by $L_n$. Therefore, the characteristics of a hetero BPT cannot be satisfactorily achieved. In the present invention, however, since a BPT can be manufactured to satisfy $W_B' \leq W_B$, reduction in $h_{FE}$ can be suppressed by determining the emitter depth $X_j$ in accordance with the emitter area.

In this embodiment, the n++ region is formed on the emitter region in order to decrease the ohmic resistance. The n++ region preferably consists of polycrystalline silicon.

Embodiment 9

FIG. 19 is a circuit diagram showing a solid state imaging apparatus using the BPT according to Embodiment 7. Referring to FIG. 19, the BPT of the Embodiment 7 is used in a portion denoted by Tr.

That is, in this embodiment, the BPT is used as a photoelectric conversion element.

When an area sensor shown in FIG. 19 is to be used as a color camera, optical information of the same photoelectric conversion element is read a plurality of times.

As described above, a nondestruction degree can be easily improved by increasing $h_{FE}$. That is, the nondestruction degree can be increased by using the BPT having the arrangement of Embodiment 7 capable of increasing $h_{FE}$.

In this embodiment, the present invention is applied to an area sensor. It is obvious, however, that the present invention can be applied to a line sensor.

What is claimed is:

1. A semiconductor device comprising an emitter region of a first conductivity type, a base region of a second conductivity type, and a collector region of said first conductivity type, wherein at least a vicinity of an interface of an emitter region to base region junction is formed by Si;
   a polycrystalline or single crystalline $Si_{1-x} C_x$ ($x \leq 0.5$) is formed on a region formed by the Si within said emitter region, and a junction between a region of the Si and a region of the polycrystalline or the single crystalline $Si_{1-x} C_x$ is a graded hetero junction and is provided at a position distant from an edge of a depletion layer produced at a junction between said emitter and base regions.

2. A semiconductor device according to claim 1, wherein said region of $Si_{1-x} C_x$ is an ion implanted region of $Si_{1-x} C_x$.

3. A semiconductor device according to claim 1, wherein on said region of $Si_{1-x} C_x$ of said emitter region, a high concentration impurity layer is provided.

4. A semiconductor device according to claim 3, wherein said high impurity concentration layer is formed by $Si_{1-x} C_x$ wherein $x > 0.0125$.

5. A semiconductor device according to claim 1, wherein x is from 0.0125 to 0.075.

6. A photoelectric conversion apparatus using a semiconductor device according to claim 1.

7. A semiconductor device comprising an emitter region of a first conductivity type, a base region of a second conductivity type, and a collector region of said first conductivity type, wherein at least a vicinity of an interface of an emitter region to base region junction is formed by Si;
   a polycrystalline or single crystalline $Si_{1-x} C_x$ ($x \leq 0.5$) is formed on a region formed by the Si within said emitter region, and a junction between the region of Si and the region of polycrystalline or single crystalline $Si_{1-x} C_x$ is a graded hetero junction and is provided at a position distant from an edge of a depletion layer produced at a junction between said emitter and base regions;
   at least a portion under the region of Si within said emitter region is formed by a single crystalline Si doped with B and Ge, and a concentration of B is no less than $1 \times 10^{18}$ cm$^{-3}$.

8. A device according to claim 7, wherein said region of $Si_{1-x} C_x$ is an ion implanted region of $Si_{1-x} C_x$.

9. A device according to claim 7, wherein $0.0125 \leq x \leq 0.075$.

10. A device according to claim 7, wherein said B and Ge are ion implanted.

11. A device according to claim 7, wherein an impurity concentration of said emitter region is less than $1 \times 10^{19}$ cm$^{-3}$.

12. A device according to claim 7, wherein the polycrystalline or single crystalline Si is doped with B and Ge so that $N_{Ge} > 8.25 N_B$ wherein $N_B$ and $N_{Ge}$ are respectively B and Ge concentrations.

13. A photoelectric conversion apparatus using a semiconductor device according to claim 7.

14. A semiconductor device comprising an emitter region of a first conductivity type, a base region of a second conductivity type, and a collector region of said first conductivity type, wherein at least a portion of the emitter side at an emitter region base region junction interface is formed by Si;

a polycrystalline or single crystalline $Si_{1-x}C_x$ ($x \leq 0.5$) is formed on a region formed by the Si within said emitter region, at least a portion under the region formed by the Si of the emitter region is formed by $Si_{1-y}Ge_y$ ($0 < y < 1$), at least one of a junction between the region of Si and the region of polycrystalline or single crystalline $Si_{1-x}C_x$ and a junction between the region of Si and the region of $Si_{1-y}Ge_y$ is a graded hetero junction; wherein said junction between the region of Si and the region of polycrystalline or single crystalline $Si_{1-x}C_x$ is provided at a position distant from an edge of a depletion layer produced at a junction between said emitter and base regions.

15. A semiconductor device according to claim 14, wherein at least one of the region of $Si_{1-x}C_x$ and the region of $Si_{1-y}Ge_y$ is an ion implanted region.

16. A semiconductor device according to claim 14 or 15, wherein $0.0125 \leq x \leq 0.075$.

17. A semiconductor device according to claim 14 wherein $0.625 \leq y \leq 0.375$.

18. A semiconductor device according to claim 14 wherein the region of $Si_{1-y}Ge_y$ is selectively formed only under the region of Si within the emitter region.

19. A photoelectric conversion apparatus using a semiconductor device according to claim 14.

20. A semiconductor device according to claim 1, 7, or 14, wherein a distance ($W_B'$) between the edge of the depletion layer and the junction between the regions formed by Si and $Si_{1-x}C_x$ is sufficiently smaller than a diffusion length ($L_p$) of carrier from said base region.

* * * * *

UNITED STATES PATENT AND TRADEMARK OFFICE
CERTIFICATE OF CORRECTION

PATENT NO. : 5,144,398
DATED : September 1, 1992
INVENTOR(S) : MASAKAZU MORISHITA Page 1 of 4

It is certified that error appears in the above-identified patent and that said Letters Patent is hereby corrected as shown below:

On drawing

SHEET 2 OF 13

FIG. 4, "401" should read --10--.

COLUMN 2

Line 56, "coefficient" should read --length--.

COLUMN 3

Line 12, "10⁻to $10^{16}cm^{-3}$" should read --$10^{14}$ to $10^{16}cm^{-3}$--.
    Line 18, "creased." should read --creased).--.

COLUMN 4

Line 34, "cross sectional" should read --cross-sectional--.
    Line 67, "enlarge" should read --enlarged--.

COLUMN 6

Line 54, "$L_P<<W_{E'}$" should read --$L_P>>W_{E'}$--.

COLUMN 7

Line 4, "$\Delta E_1<<kT$" should read --$\Delta E_1>>kT$--.
    Line 51, "difference $E_c$" should read --difference $\Delta E_c$--.
    Line 60, "interfere" should read --interfere with--.

COLUMN 8

Line 15, "$1\Delta E_c/2$" should read --$\Delta E_c/2$--.
    Line 42, "$5\times cm^{-3}$" should read --$5\times 10^{22} cm^{-3}$--.

UNITED STATES PATENT AND TRADEMARK OFFICE
CERTIFICATE OF CORRECTION

PATENT NO. : 5,144,398

DATED : September 1, 1992

INVENTOR(S) : MASAKAZU MORISHITA

It is certified that error appears in the above-identified patent and that said Letters Patent is hereby corrected as shown below:

COLUMN 10

Line 53, "$\epsilon_m=[\{2\epsilon_s/q\}\{(N_B \cdot N_D)/(N_B+N_D)\}\{V_{bi}+V\}^{\frac{1}{2}}$" should read --$W=[\{2\epsilon_s/q\}\{(N_B \cdot N_D)/(N_B+N_D)\}\{V_{bi}+V\}]^{\frac{1}{2}}$--.

Line 64, "The concentration" should read --The emitter concentration--.

COLUMN 11

Line 21, "$N_B > 1 \times cm^{-3}$" should read --$N_B > 1 \times 10^{18} cm^{-3}$--.

Line 66, "$100 \times (r_{Ge} r_{Si})/r_{Si}$" should read --$100 \times (r_{Ge} - r_{Si})/r_{Si}$--.

COLUMN 12

Line 48, "(symbol o)" should read --(symbol ●)--.

COLUMN 13

Line 1, "or and" should read --or less, and--.

Line 12, "$\Delta E_g \geq 0.15$" should read --$\Delta E_g > 0.15$--.

Line 33, "(14)" should read --2-(17)--.

COLUMN 14

Line 10, "n -type region 3" should read --n⁻-type region 3--.

Line 20, "$1 \times 10^{16 to} 10^{19}$" should read --$1 \times 10^{16}$ to $10^{19}$--.

Line 30, "$1 \times 10^{16 \, cm^{-3}}$)" should read --$1 \times 10^{16} cm^{-3}$)--.

COLUMN 15

Line 14, "or less" should be deleted.

Line 20, "$10 < cm^{-3}$" should read --$10^{21} cm^{-3}$--.

Line 31, "(12)" should read --2-(18)--.

UNITED STATES PATENT AND TRADEMARK OFFICE
CERTIFICATE OF CORRECTION

PATENT NO. : 5,144,398

DATED : September 1, 1992

INVENTOR(S) : MASAKAZU MORISHITA

It is certified that error appears in the above-identified patent and that said Letters Patent is hereby corrected as shown below:

COLUMN 18

Line 38, "HALK" should read --HBLK--.
Line 40, "TH=50" should read --$T_H$=50--.
Line 41, "TH=26" should read --$T_H$=26--.
Line 42, "nsec/2,000=13 nsec" should read
--μsec/2,000=13 nsec--.
Line 44, "$f_T \geq 6$" should read --$f_T > 6$--.

COLUMN 19

Line 29, "FIG. 3," should read --FIG. 5--.
Line 56, "surface in" should read --surface is cleaned in--.

COLUMN 20

Line 34, "$D_C$" should read --$D_C <$--.

COLUMN 21

Line 2, "(15)" should read --2-(19)--.
Line 4, "ΔE" should read --$A_E$--.
Line 9, "(16)" should read --2-(20)--.
Line 13, "no be" should read --no longer be--.
Line 20, "$wW_{B'}/W_B$" should read --$2W_{B'}/W_B$-- and
"(17)" should read --2-(21)--.
Line 32, "(18)" should read --2-(22)--.
Line 41, "(19)" should read --2-(23)--.

COLUMN 23

Line 7, "emitter region base region" should read
--emitter region-base region--.

UNITED STATES PATENT AND TRADEMARK OFFICE
CERTIFICATE OF CORRECTION

PATENT NO.   : 5,144,398

DATED        : September 1, 1992

INVENTOR(S)  : MASAKAZU MORISHITA

It is certified that error appears in the above-identified patent and that said Letters Patent is hereby corrected as shown below:

COLUMN 24

Line 9, "$0.625 \leq y \leq 0.375$" should read --$0.0625 \leq y \leq 0.375$--.
Line 11, "$Si_{1-y}Gey$" should read --$Si_{1-y}Ge_y$--.
Line 15, "claim 1," should read --claims 1,--.

Signed and Sealed this

Eighteenth Day of January, 1994

Attest:

BRUCE LEHMAN

Attesting Officer

Commissioner of Patents and Trademarks